US012749442B2

(12) United States Patent
Yoo et al.

(10) Patent No.: US 12,749,442 B2
(45) Date of Patent: Sep. 29, 2026

(54) DISPLAY DEVICE AND ELECTRONIC DEVICE INCLUDING THE SAME

(71) Applicant: SAMSUNG DISPLAY CO., LTD., Yongin-si (KR)

(72) Inventors: Gi Na Yoo, Yongin-si (KR); Hyo Min Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 19/198,665

(22) Filed: May 5, 2025

(65) Prior Publication Data

US 2026/0065855 A1 Mar. 5, 2026

(30) Foreign Application Priority Data

Aug. 28, 2024 (KR) ........................ 10-2024-0115788

(51) Int. Cl.

| | |
|---|---|
| ***G09G 3/3275*** | (2016.01) |
| ***G09G 3/3225*** | (2016.01) |
| ***H10K 59/122*** | (2023.01) |
| ***H10K 59/35*** | (2023.01) |
| *G09G 3/32* | (2016.01) |

(52) U.S. Cl.

CPC ......... *G09G 3/3225* (2013.01); *G09G 3/3275* (2013.01); *H10K 59/122* (2023.02); *H10K 59/353* (2023.02); *G09G 3/32* (2013.01); *G09G 2320/0233* (2013.01); *G09G 2320/0242* (2013.01); *G09G 2320/0606* (2013.01); *G09G 2320/068* (2013.01); *G09G 2354/00* (2013.01); *G09G 2358/00* (2013.01)

(58) Field of Classification Search

CPC ............... H10K 59/126; H10K 59/353; H10K 59/3275; G09G 3/3275; G09G 2300/0452; G09G 2320/028; G09G 2358/00

See application file for complete search history.

(56) References Cited

U.S. PATENT DOCUMENTS

| | | | | |
|---|---|---|---|---|
| 2018/0364827 | A1* | 12/2018 | Chung | G06F 1/1677 |
| 2023/0126522 | A1 | 4/2023 | Wu et al. | |
| 2023/0230521 | A1* | 7/2023 | Wu | G09G 3/2096 345/428 |
| 2024/0215415 | A1 | 6/2024 | Ji et al. | |

FOREIGN PATENT DOCUMENTS

| | | | |
|---|---|---|---|
| KR | 10-2022-0008699 | A | 1/2022 |
| KR | 10-2024-0099538 | A | 7/2024 |

* cited by examiner

*Primary Examiner* — Kevin M Nguyen

(74) *Attorney, Agent, or Firm* — F. CHAU & ASSOCIATES, LLC

(57) ABSTRACT

A display device operating in a first mode and a second mode includes first green sub-pixels, and second green sub-pixels having a viewing angle less than that of the first green sub-pixels. In the first mode and the second mode, the first green sub-pixels and the second green sub-pixels are driven.

18 Claims, 20 Drawing Sheets

FIG. 12

| PIXEL | SUB-PIXEL | θ° | LOR(%) | |
|---|---|---|---|---|
| PX1 | R1 | 60° | 89% | 89%:89%:90% =1.00:1.00:1.01 |
| | G1 | | 89% | |
| | B1 | | 90% | |
| PX2 | R2 | | 67% | 67%:65%:68% =1.00:0.97:1.01 |
| | G2 | | 65% | |
| | B2 | | 68% | |

DISPLAY DEVICE AND ELECTRONIC DEVICE INCLUDING THE SAME

CROSS-REFERENCE TO RELATED APPLICATION

This application claims priority under 35 U.S.C. § 119 to Korean Patent Application No. 10-2024-0115788, filed on Aug. 28, 2024 in the Korean Intellectual Property Office, the disclosure of which is incorporated by reference herein in its entirety.

TECHNICAL FIELD

The present disclosure relates to a display device and an electronic device including the display device.

DISCUSSION OF RELATED ART

As information technology develops, the importance of a display device, which is a connection medium between a user and information, is emerging.

Personal information displayed on the display device in a public place or multi-use facility may be exposed. Accordingly, a technology for adjusting a viewing angle of the display device so that a screen is not easily visible to surrounding other people is being developed.

SUMMARY

The present disclosure provides a display device capable of preventing deterioration of display quality at a high viewing angle and an electronic device including the display device.

According to an aspect of the present disclosure, a display device may include a controller configured to generate a first data control signal for operating the display device in a first mode and a second data control signal for operating the display device in a second mode, a data driver configured to receive one of the first data control signal and the second data control signal, a plurality of first green sub-pixels connected to the data driver, and a plurality of second green sub-pixels connected to the data driver and having a viewing angle less than a viewing angle of the plurality of first green sub-pixels. The data driver is configured further to drive, in the first mode and the second mode, the plurality of first green sub-pixels and the plurality of second green sub-pixels.

In an embodiment, in the first mode, the first green sub-pixels and the second green sub-pixels may be driven with a first luminance, and in the second mode, the second green sub-pixels may be driven with a second luminance lower than the first luminance, and the first green sub-pixels may be driven with a third luminance lower than the second luminance.

In an embodiment, a sum of the second luminance and the third luminance may be equal to the first luminance.

In an embodiment, the display device may further include first red sub-pixels, second red sub-pixels having a viewing angle less than a viewing angle of the first red sub-pixels, first blue sub-pixels, and second blue sub-pixels having a viewing angle less than a viewing angle of the first blue sub-pixels, an aperture ratio corresponding to the first green sub-pixels and the second green sub-pixels may be less than an aperture ratio corresponding to the first red sub-pixels and the second red sub-pixels, and an aperture ratio corresponding to the first blue sub-pixels and the second blue sub-pixels may be greater than the aperture ratio corresponding to the first red sub-pixels and the second red sub-pixels.

In an embodiment, in the second mode, the second red sub-pixels and the second blue sub-pixels may be driven with the first luminance, and the first red sub-pixels and the first blue sub-pixels may not be driven.

In an embodiment, in the second mode, the third luminance may be set to a value so that a ratio of a luminance of red light output from the second red sub-pixels, a luminance of green light output from the first green sub-pixels and the second green sub-pixels, and a luminance of blue light output from the second blue sub-pixels at a first viewing angle is equal to a ratio of a luminance of red light output from the first red sub-pixels, a luminance of green light output from the first green sub-pixels, and a luminance of blue light output from the first blue sub-pixels at the first viewing angle.

In an embodiment, in the second mode, the first blue sub-pixels may be further driven.

In an embodiment, in the second mode, the second blue sub-pixels may be driven with a fourth luminance lower than the first luminance, and the first blue sub-pixels may be driven with a fifth luminance lower than the fourth luminance.

In an embodiment, a sum of the fourth luminance and the fifth luminance may be equal to the first luminance.

According to an aspect of the present disclosure, a display device operating in a first mode and a second mode may include a first pixel including a first bank disposed on a display element layer, and a second pixel including the first bank disposed on the display element layer and a second bank disposed on the first bank and overlapping the first bank, and in the first mode and the second mode, first green sub-pixels of the first pixel and second green sub-pixels of the second pixel may be driven.

In an embodiment, in the first mode, the first green sub-pixels and the second green sub-pixels may be driven with a first luminance, in the second mode, the second green sub-pixels may be driven with a second luminance lower than the first luminance, and the first green sub-pixels may be driven with a third luminance lower than the second luminance.

In an embodiment, a sum of the second luminance and the third luminance may be equal to the first luminance.

In an embodiment, an aperture ratio corresponding to the first green sub-pixels and the second green sub-pixels may be less than an aperture ratio corresponding to a first red sub-pixel of the first pixel and a second red sub-pixel of the second pixel, and the aperture ratio corresponding to the first red sub-pixel and the second red sub-pixel may be less than an aperture ratio corresponding to a first blue sub-pixel of the first pixel and a second blue sub-pixel of the second pixel.

In an embodiment, in the second mode, the second red sub-pixel and the second blue sub-pixel may be driven with the first luminance, and the first red sub-pixel and the first blue sub-pixel may not be driven.

In an embodiment, the third luminance may be set to a value so that a ratio of a luminance of red light output from the second red sub-pixel, a luminance of green light output from the first green sub-pixels and the second green sub-pixels, and a luminance of blue light output from the second blue sub-pixel at a first viewing angle is equal to a ratio of a luminance of red light output from the first red sub-pixel, a luminance of green light output from the first green sub-pixels, and a luminance of blue light output from the first blue sub-pixel at the first viewing angle, in the second mode.

In an embodiment, in the second mode, the first blue sub-pixel may be further driven.

In an embodiment, in the second mode, the second blue sub-pixel may be driven with a fourth luminance lower than the first luminance, and the first blue sub-pixel may be driven with a fifth luminance lower than the fourth luminance.

In an embodiment, a sum of the fourth luminance and the fifth luminance may be equal to the first luminance.

An electronic device includes a processor to provide input image data and a display device to display an image based on the input image data, the display device operating in a first mode and a second mode. The display device may include a controller configured to generate a first data control signal for operating the display device in a first mode and a second data control signal for operating the display device in a second mode, a data driver configured to receive one of the first data control signal and the second data control signal, a plurality of first green sub-pixels connected to the data driver, and a plurality of second green sub-pixels connected to the data driver and having a viewing angle less than a viewing angle of the plurality of first green sub-pixels. The data driver is configured further to drive, in the first mode and the second mode, the plurality of first green sub-pixels and the plurality of second green sub-pixels.

An electronic device includes a processor to provide input image data and a display device to display an image based on the input image data, the display device operating in a first mode and a second mode. The display device includes a first pixel including a first bank disposed on a display element layer and a second pixel including the first bank disposed on the display element layer and a second bank disposed on the first bank and overlapping the first bank. In the first mode and the second mode, first green sub-pixels of the first pixel and second green sub-pixels of the second pixel are driven.

The electronic device includes further includes a memory having stored application programs for execution by the processor, and a user interface configured to sense user input via touch or cursor select of an icon presented on the display device to switch an operation mode of the display device from the first mode to the second mode, wherein the processor is caused to execute one or more of the stored application programs upon receipt of the user input.

According to embodiments of the disclosure, deterioration of display quality may be prevented by reducing a luminance difference between sub-pixels at a high viewing angle.

However, an effect of the disclosure is not limited to that described above, and may be expanded variously without departing from the spirit and scope of the disclosure.

BRIEF DESCRIPTION OF THE DRAWINGS

The above and other features of the present disclosure will become more apparent by describing in detail embodiments thereof with reference to the accompanying drawings, in which:

FIGS. 10 to 13 are drawings illustrating an operation principle of a second mode of a display device according to an embodiment of the present disclosure;

DETAILED DESCRIPTION OF THE EMBODIMENT

Figure 1:
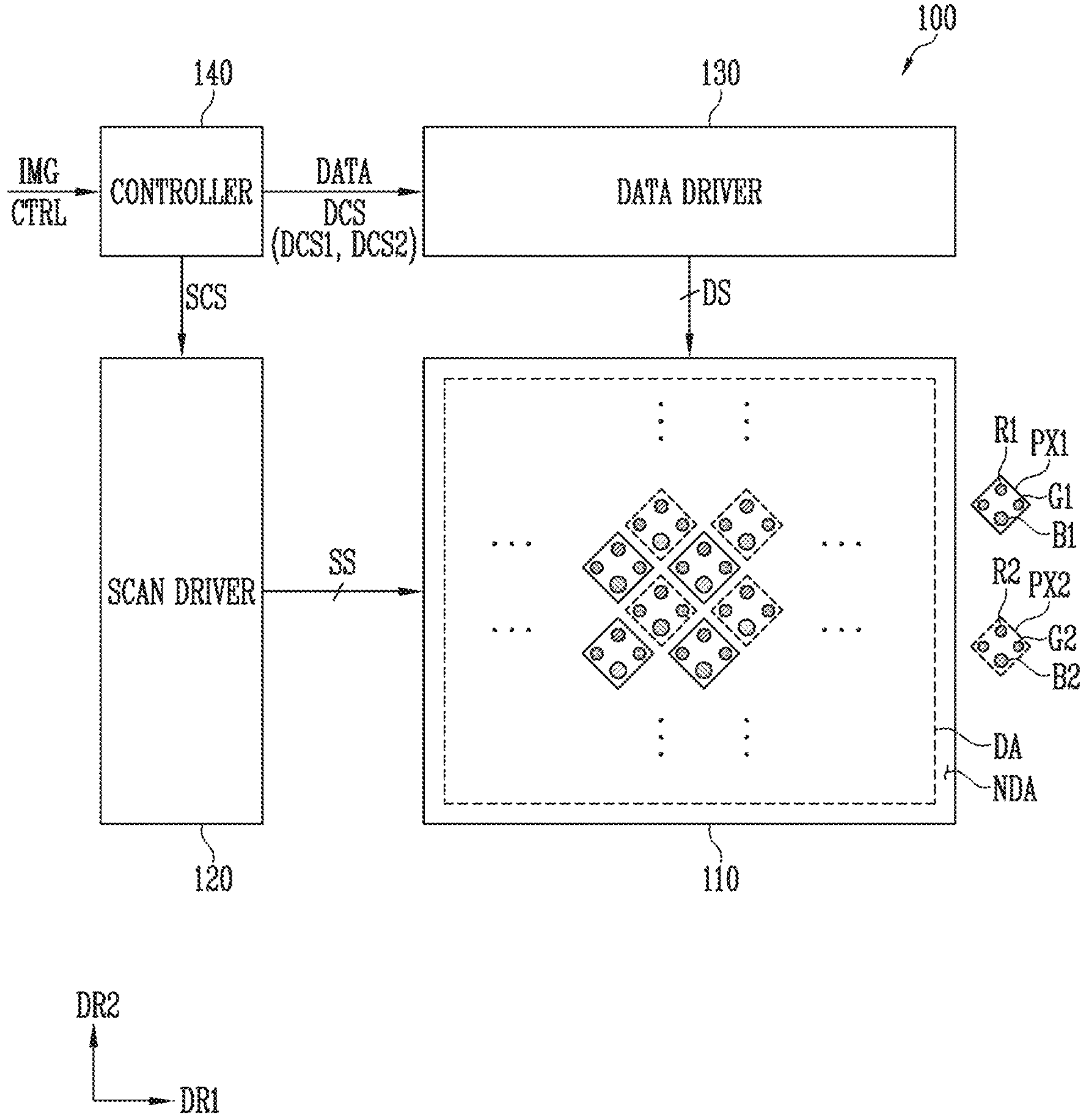
FIG. 1 is a block diagram of a display device according to an embodiment of the present disclosure.

Hereinafter, various embodiments according to the disclosure are described in detail with reference to the accompanying drawings. It should be noted that in the following description, portions necessary for understanding an operation according to the disclosure are described, and descriptions of other portions may be omitted in order not to obscure the subject matter of the disclosure. The disclosure may be embodied in other forms without necessarily being limited to the embodiment described herein. However, the embodiment described herein is provided to describe in detail enough to easily implement the technical spirit of the disclosure to those skilled in the art to which the disclosure belongs.

Throughout the specification, in a case where a portion is "connected" to another portion, the case includes not only a case where the portion is "directly connected" but also a case where the portion is "indirectly connected" with another element interposed therebetween. Terms used herein are for describing specific embodiments and are not necessarily intended to limit the disclosure. Throughout the specification, in a case where a certain portion "includes", the case means that the portion may further include another component without excluding another component unless otherwise stated. "At least any of X, Y, and Z" and "at least any selected from a group consisting of X, Y, and Z" may be interpreted as one X, one Y, one Z, or any combination of two or more of X, Y, and Z (for example, XYZ, XYY, YZ, and ZZ). Here, "and/or" includes all combinations of one or more of corresponding configurations.

Here, terms such as first and second may be used to describe various components, but these components are not necessarily limited to these terms. These terms are used to distinguish one component from another component. Therefore, a first component may refer to a second component within a range without departing from the scope disclosed herein.

Spatially relative terms such as "under", "on", and the like may be used for descriptive purposes, thereby describing a relationship between one element or feature and another element(s) or feature(s) as shown in the drawings. Spatially relative terms are intended to include other directions in use, in operation, and/or in manufacturing, in addition to the direction depicted in the drawings. For example, when a device shown in the drawing is turned upside down, elements depicted as being positioned "under" other elements or features are positioned in a direction "on" the other elements or features. Therefore, in an embodiment, the term "under" may include both directions of on and under. The device may face in other directions (for example, rotated 90 degrees or in other directions) and thus the spatially relative terms used herein are interpreted according thereto.

Various embodiments are described with reference to drawings schematically illustrating ideal embodiments. Accordingly, it will be expected that shapes may vary, for example, according to tolerances and/or manufacturing techniques. Therefore, the embodiments disclosed herein should not necessarily be construed as being limited to shown specific shapes, and should be interpreted as including, for example, changes in shapes that occur as a result of manufacturing. While each drawing may represent one or more particular embodiments of the present disclosure, drawn to scale, such that the relative lengths, thicknesses, and angles can be inferred therefrom, it is to be understood that the present invention is not necessarily limited to the relative lengths, thicknesses, and angles shown. Changes to these values may be made within the spirit and scope of the present disclosure, for example, to allow for manufacturing limitations and the like.

The present invention relates to driving both a wide pixel (a first pixel) and a narrow pixel (a second pixel) in a private mode (a second mode), wherein the luminance of the narrow pixel (a second pixel) is greater than the luminance of the wide pixel (a first pixel).

Hereinafter, embodiments of the disclosure are described in detail with reference to the attached drawings.

FIG. 1 is a block diagram of a display device according to an embodiment.

Referring to FIG. 1, the display device 100 may be a device that displays an image and may be applied to an electronic device such as a mobile phone, a smart phone, a tablet PC, a smart watch, a watch phone, a mobile communication terminal, an electronic notebook, an electronic book, a portable multimedia player (PMP), a navigation device, an ultra-mobile PC (UMPC), and a laptop. However, embodiments are not necessarily limited thereto.

The display device 100 may include a display panel 110, a scan driver 120, a data driver 130, and a controller 140.

The display panel 110 may include a display area DA and a non-display area NDA.

The display area DA may be an area that displays an image and may be defined as a central area of the display panel 110. The display area DA may include first pixels PX1 and second pixels PX2. The first pixels PX1 and the second pixels PX2 may be arranged in a zigzag form in a first direction DR1 and a second direction DR2, and may be alternately arranged in the first direction DR1 and the second direction DR2. However, embodiments are not necessarily limited thereto. For example, the first pixels PX1 and the second pixels PX2 may be arranged in a stripe form in the first direction DR1 and the second direction DR2, and may be alternately arranged in the first direction DR1 and the second direction DR2. An arrangement of the first pixels PX1 and the second pixels PX2 may be variously changed according to a type of an electronic device to which the display device 100 is applied.

The first pixel PX1 may have a diamond structure. For example, the first pixel PX1 may have a diamond structure by including a first red sub-pixel R1, two first green sub-pixels G1, and a first blue sub-pixel B1. The first red sub-pixel R1, the two first green sub-pixels G1, and the first blue sub-pixel B1 may have a round form. A size of the first green sub-pixel G1 may be less than a size of the first red sub-pixel R1. The size of the first red sub-pixel R1 may be less than a size of the first blue sub-pixel B1.

The second pixel PX2 may have a diamond structure. For example, the second pixel PX2 may have a diamond structure by including a second red sub-pixel R2, two second green sub-pixels G2, and a second blue sub-pixel B2. The second red sub-pixel R2, the two second green sub-pixels G2, and the second blue sub-pixel B2 may have a round form. A size of the second green sub-pixel G2 may be less than a size of the second red sub-pixel R2. The size of the second red sub-pixel R2 may be less than a size of the second blue sub-pixel B2.

However, embodiments are not necessarily limited thereto. For example, the first pixel PX1 and the second pixel PX2 may have a diamond structure, and the first and second red sub-pixels R1 and R2, the first and second green sub-pixels G1 and G2, and the first and second blue sub-pixels B1 B2 may have an angular form rather than a round form. The structure of the first pixel PX1 and the second pixel PX2 and the form of the first and second red sub-pixels R1 and R2, the first and second green sub-pixels G1 and G2, and the first and second blue sub-pixels B1 and B2 may be variously changed according to a type of an electronic device to which the display device 100 is applied.

The non-display area NDA may be defined as a remaining area of the display panel 110 excluding the display area DA. The non-display area NDA may include various lines or a pad unit.

The scan driver 120 may apply scan signals SS to the first pixels PX1 and the second pixels PX2 based on a scan control signal SCS. For example, the scan driver 120 may sequentially apply the scan signals SS to the first pixels PX1 and the second pixels PX2 in a row unit.

The data driver 130 may apply data signals DS to the first pixels PX1 and the second pixels PX2 based on image data DATA and a data control signal DCS. For example, the data driver 130 may sequentially apply the data signals DS to the first pixels PX1 and the second pixels PX2 in a row unit in synchronization with the scan signals SS.

The controller 140 may control overall operations of the display device 100. The controller 140 may receive input image data IMG and a control signal CTRL from an outside (for example, a processor). The controller 140 may provide the scan control signal SCS to the scan driver 120 based on the control signal CTRL. The controller 140 may provide the data control signal DCS to the data driver 130 based on the control signal CTRL. The controller 140 may generate image data DATA by converting the input image data IMG and may provide the image data DATA to the data driver 130. In an embodiment, the controller 140 may support a first mode and a second mode, which will be described below. In the first mode, sub-pixels of a pixel are controlled to generate lights according to color values of the input data IMG. In the second mode, the color values of the input data IMG may be adjusted to control viewing angles. In the second mode, the scan driver 120 may supply the scan signals SS to all pixels like in the first mode, but the data driver 130 may selectively turn off first red sub-pixels R1 and first blue sub-pixels B1, for example, according to color values of the data signal DS. The data signal DS generated by the data driver 130 may define which sub-pixels within the activated row by a scan signal SS are driven and at what intensity. In an embodiment, the data control signal DCS may have a first data control signal DCS1 for operating the display device 100 in the first mode which is a default operation mode of the display device 100, and in response to a user's input, the controller 140 may generate a second control signal DCS2 for operating the display device 100 in the second mode. The second control signal DCS2 may enable the data driver 130 to define which sub-pixels within the activated row by a scan signal SS are driven at what intensity.

Figure 2:
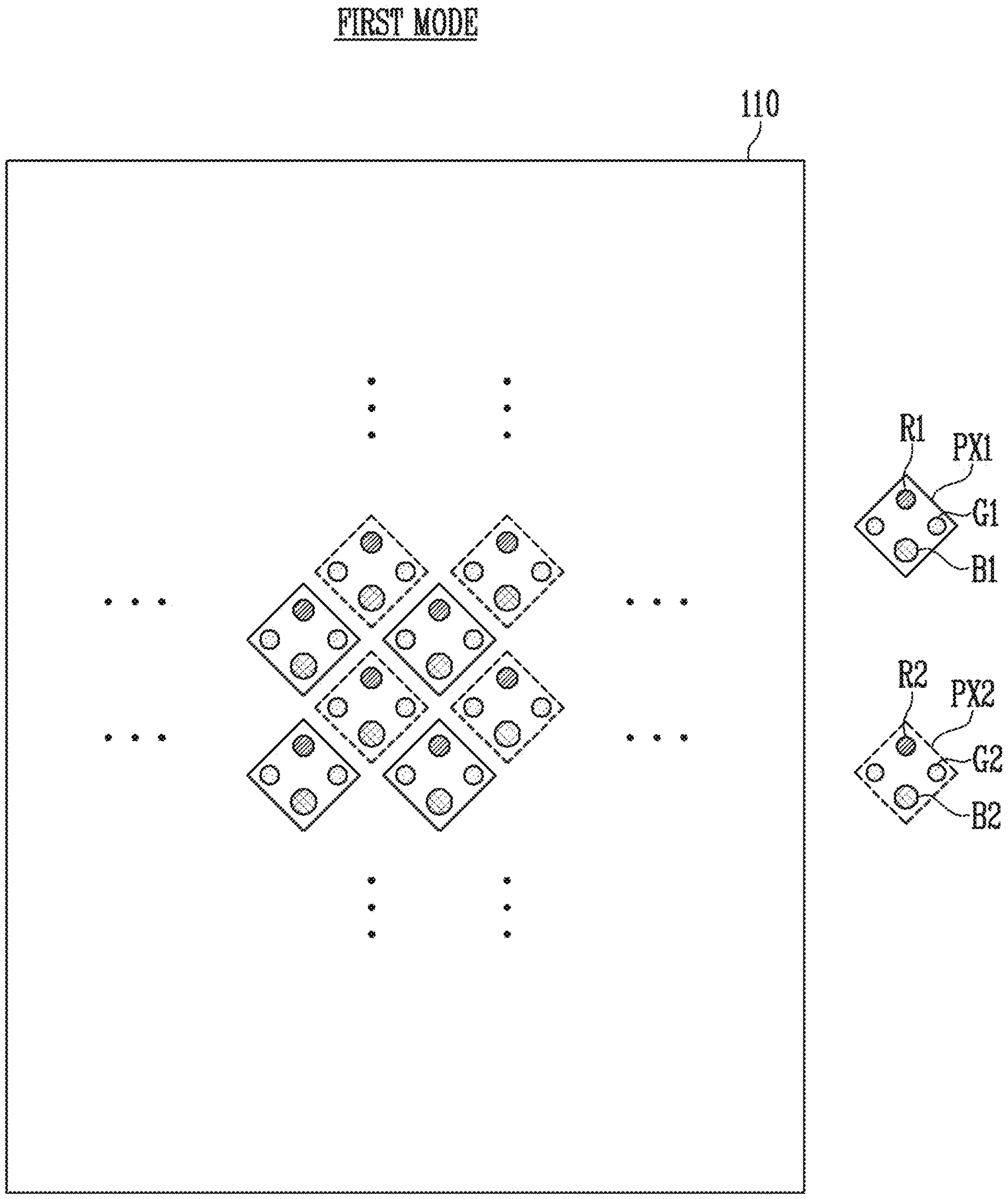
FIG. 2 is a diagram illustrating a first mode of a display device according to an embodiment of the present disclosure.
Figure 3:
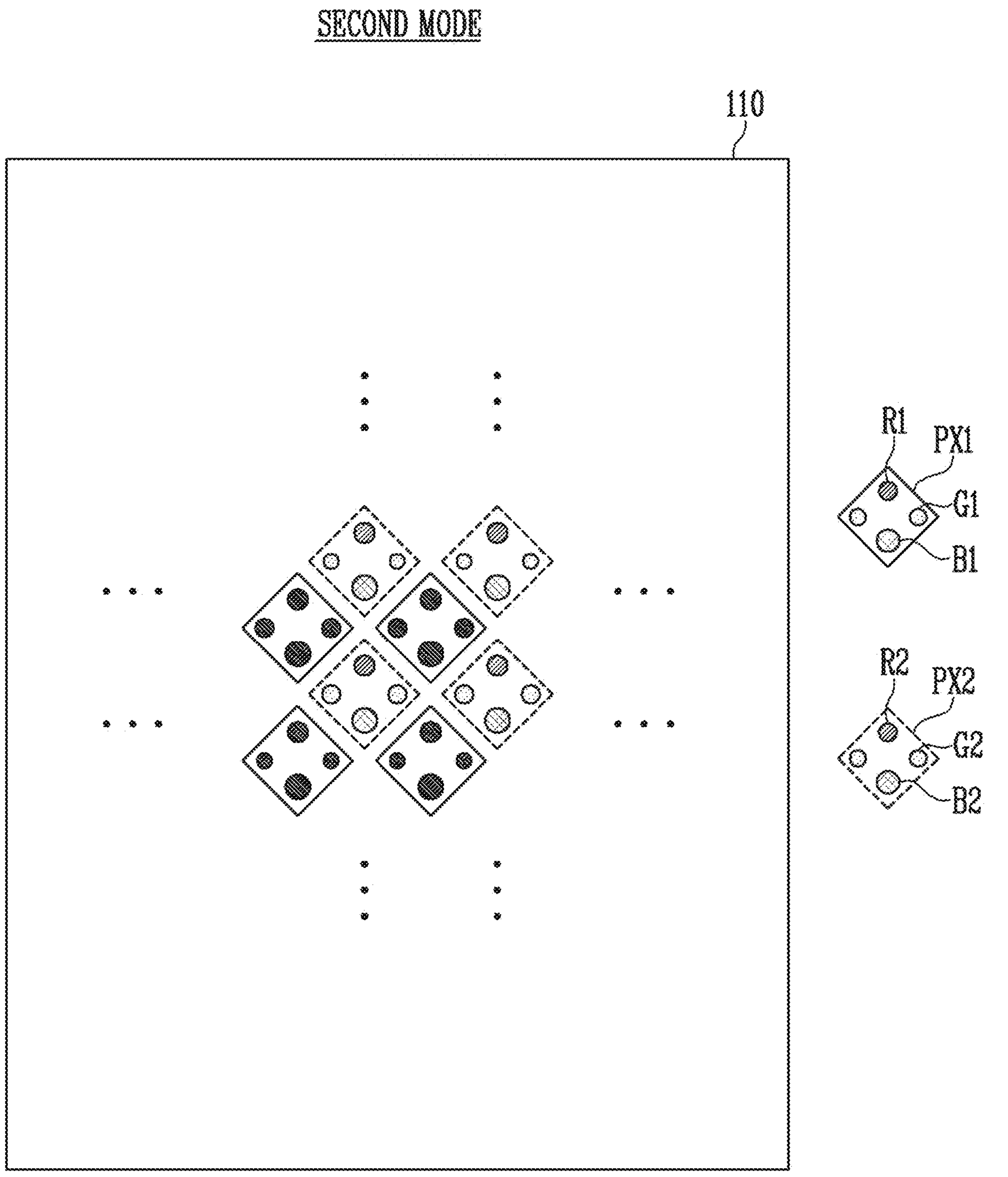
FIG. 3 is a diagram illustrating a second mode of a display device according to an embodiment of the present disclosure.

FIG. 2 is a drawing illustrating a first mode of a display device according to an embodiment. FIG. 3 is a drawing illustrating a second mode of a display device according to an embodiment.

Referring to FIGS. 2 and 3, the display device 100 (refer to FIG. 1) may selectively operate in one of the first mode and the second mode. For example, the display device 100 may be switched from the first mode to the second mode or from the second mode to the first mode in response to a user's input.

Referring to FIG. 2, the display device 100 (refer to FIG. 1) may operate in the first mode. The first mode may refer to a general mode in which viewing angle adjustment is not required. For example, the first mode may refer to a state in which an image displayed on the display panel 110 is visible to surrounding other people including a user of the display device 100. When the display device 100 operates in the first mode, the first pixels PX1 and the second pixels PX2 may be driven, and thus the image displayed on the display panel 110 may be provided at a wide viewing angle. A detailed description thereof is described later with reference to FIG. 5.

Referring to FIG. 3, the display device 100 (refer to FIG. 1) may operate in the second mode. The second mode may refer to a private mode in which viewing angle adjustment is required. For example, the second mode may refer to a state in which the image displayed on the display panel 110 is visible to the user of the display device 100 and is not visible to the surrounding other people. Therefore, when the display device 100 operates in the second mode, exposure of personal information included in the image displayed on the display panel 110 may be prevented. When the display device 100 operates in the second mode, the second pixels PX2 may be driven, the first pixels PX1 may not be driven, and thus the image displayed on the display panel 110 may be provided at a narrow viewing angle. A detailed description thereof is described later with reference to FIG. 7.

Figure 4:
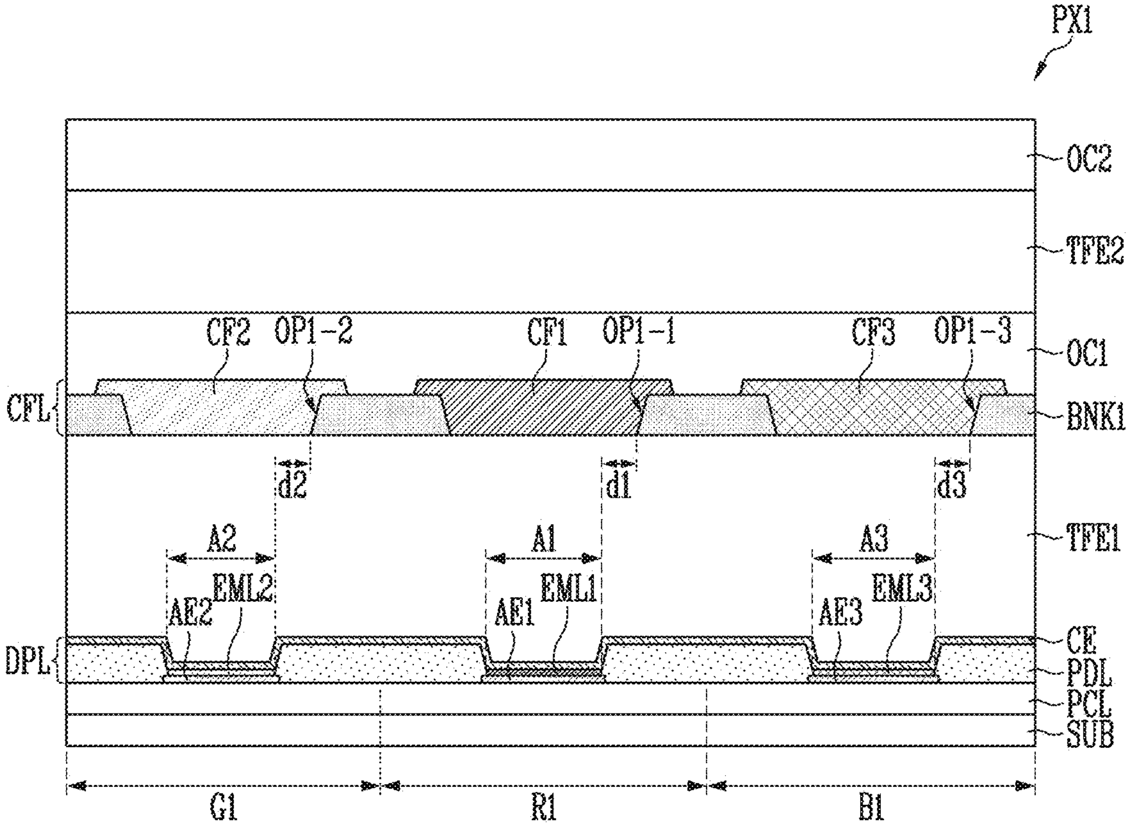
FIG. 4 is a cross-sectional view of a first pixel according to an embodiment of the present disclosure.

FIG. 4 is a cross-sectional view of a first pixel according to an embodiment. For convenience of description, FIG. 4 shows a structure of a first pixel PX1 including a first red sub-pixel R1, a first green sub-pixel G1, and a first blue sub-pixel B1.

Referring to FIG. 4, a substrate SUB may be a glass substrate, a polyimide (PI) substrate, or a silicon wafer substrate, but embodiments are not necessarily limited thereto.

A pixel circuit layer PCL may be disposed on the substrate SUB. The pixel circuit layer PCL may include a pixel circuit for driving the first red sub-pixel R1, a pixel circuit for driving the first green sub-pixel G1, and a pixel circuit for driving the first blue sub-pixel B1. Each pixel circuit may include transistors and at least one capacitor.

A display element layer DPL may be disposed on the pixel circuit layer PCL. The display element layer DPL may include first to third anodes AE1 to AE3, a pixel defining layer PDL, first to third light emitting layers EML1 to EML3, and a cathode CE.

The first to third anodes AE1 to AE3 may be disposed on the pixel circuit layer PCL. The first to third anodes AE1 to AE3 may be spaced apart from each other. The first anode AE1 may be included in the first red sub-pixel R1, the second anode AE2 may be included in the first green sub-pixel G1, and the third anode AE3 may be included in the first blue sub-pixel B1.

The pixel defining layer PDL may be disposed on the pixel circuit layer PCL. The pixel defining layer PDL may be partially disposed on the first to third anodes AE1 to AE3. For example, the pixel defining layer PDL may be disposed on edges of the first to third anodes AE1 to AE3. The pixel defining layer PDL may include a light blocking material to prevent light of different colors from being mixed. For example, the pixel defining layer PDL may include a black pigment or a black dye, but embodiments are not necessarily limited thereto.

The first to third light emitting layers EML1 to EML3 may be respectively disposed on the first to third anodes AE1 to AE3. The first light emitting layer EML1 may include a material emitting red light, the second light emitting layer EML2 may include a material emitting green light, and the third light emitting layer EML3 may include a material emitting blue light. The first to third light emitting layers EML1 to EML3 may include an organic light emitting material, an inorganic light emitting material, an organic-inorganic composite light emitting material, or a quantum dot material emitting light of a corresponding color, but embodiments are not necessarily limited thereto.

The first to third light emitting layers EML1 to EML3 may have different light emission areas. For example, the light emission area A2 of the second light emitting layer EML2 may be less than the light emission area A1 of the first light emitting layer EML1 when viewed in a plan view. The light emission area A1 of the first light emitting layer EML1 may be less than the light emission area A3 of the third light emitting layer EML3 when viewed in the plan view. In an embodiment, an aperture ratio of the first green sub-pixel G1 may be less than an aperture ratio of the first red sub-pixel R1, and the aperture ratio of the first red sub-pixel R1 may be less than an aperture ratio of the first blue sub-pixel B1. In an embodiment, when a pixel includes a pair of first green sub-pixels G1, a first red sub-pixel R1, and a first blue sub-pixel B1, an aperture ratio of the pair of first green sub-pixels G1 may be less than an aperture ratio of the first red sub-pixel R1, which is less than an aperture ratio of the first blue sub-pixel B1.

Since a human's eye perceives green best, the light emission area A2 of the second light emitting layer EML2 emitting green light (or the aperture ratio of the first green sub-pixel G1) may be designed to be the smallest. However, embodiments are not necessarily limited thereto. For example, a size relationship between the light emission area A1 of the first light emitting layer EML1, the light emission area A2 of the second light emitting layer EML2, and the light emission area A3 of the third light emitting layer EML3 may be changed according to a structure of the first pixel PX1, and a type or a characteristic of a material included in the first to third light emitting layers EML1 to EML3.

The cathode CE may be disposed on the pixel defining layer PDL and the first to third light emitting layers EML1 to EML3. The cathode CE may be a common layer and may extend across the first red sub-pixel R1, the first green sub-pixel G1, and the first blue sub-pixel B1.

A first encapsulation layer TFE1 may be disposed on the cathode CE. The first encapsulation layer TFE1 may prevent oxygen or moisture from penetrating into the display element layer DPL. The first encapsulation layer TFE1 may have a sandwich structure. For example, the first encapsulation layer TFE1 may have a structure in which an organic layer and an inorganic layer are alternately stacked.

A color filter layer CFL may be disposed on the first encapsulation layer TFE1. The color filter layer CFL may include a first bank BNK1 and first to third color filters CF1 to CF3.

The first bank BNK1 may be disposed on the first encapsulation layer TFE1. The first bank BNK1 may partially overlap the pixel defining layer PDL on the first encapsulation layer TFE1. The first bank BNK1 may include a light blocking material to control a viewing angle of light emitted from the first to third light emitting layers EML1 to EML3.

The first bank BNK1 may form a (1-1)-th opening OP1-1, a (1-2)-th opening OP1-2, and a (1-3)-th opening OP1-3 having different sizes. For example, a size of the (1-2)-th opening OP1-2 may be less than a size of the (1-1)-th opening OP1-1. The size of the (1-1)-th opening OP1-1 may be less than a size of the (1-3)-th opening OP1-3.

In an embodiment, the aperture ratio may refer to the proportion of the pixel area that is available for light transmission or emission. It is a measure of how efficiently the pixel can produce light. For example, the aperture ratio may be obtained by dividing a transmitting area by a pixel area. For the first green sub-pixel G1, the transmitting area may correspond to the (1-2)-th opening OP1-2 of the first bank BNK1, and the pixel area may correspond to the light emission area A2 of the second light emitting layer EML2. For the first red sub-pixel R1, the transmitting area may correspond to the (1-1)-th opening OP1-1 of the first bank BNK1, and the pixel area may correspond to the light emission area A1 of the first light emitting layer EML1. For the first blue sub-pixel B1, the transmitting area may correspond to the (1-3)-th opening OP1-3 of the first bank BNK1, and the pixel area may correspond to the light emission area A3 of the second light emitting layer EML3.

The first color filter CF1 may be disposed in the (1-1)-th opening OP1-1. The first color filter CF1 may transmit red light emitted from the first light emitting layer EML1 and block light of other colors. The second color filter CF2 may be disposed in the (1-2)-th opening OP1-2. The second color filter CF2 may transmit green light emitted from the second light emitting layer EML2 and block light of other colors. The third color filter CF3 may be disposed in the (1-3)-th opening OP-13. The third color filter CF3 may transmit blue light emitted from the third light emitting layer EML3 and block light of other colors.

A first overcoat layer OC1 may be disposed on the color filter layer CFL. The first overcoat layer OC1 may prevent moisture or oxygen from penetrating into the color filter layer CFL. The first overcoat layer OC1 may include an organic material, but embodiments are not necessarily limited thereto.

A second encapsulation layer TFE2 may be disposed on the first overcoat layer OC1. The second encapsulation layer TFE2 may prevent moisture or oxygen from penetrating into lower configurations. The second encapsulation layer TFE2 may be configured of substantially the same material and structure as the first encapsulation layer TFE1, but embodiments are not necessarily limited thereto.

The second overcoat layer OC2 may be disposed on the second encapsulation layer TFE2. The second overcoat layer OC2 may prevent moisture or oxygen from penetrating into lower configurations. The second overcoat layer OC2 may include substantially the same material as the first overcoat layer OC1, but embodiments are not necessarily limited thereto.

Figure 5:
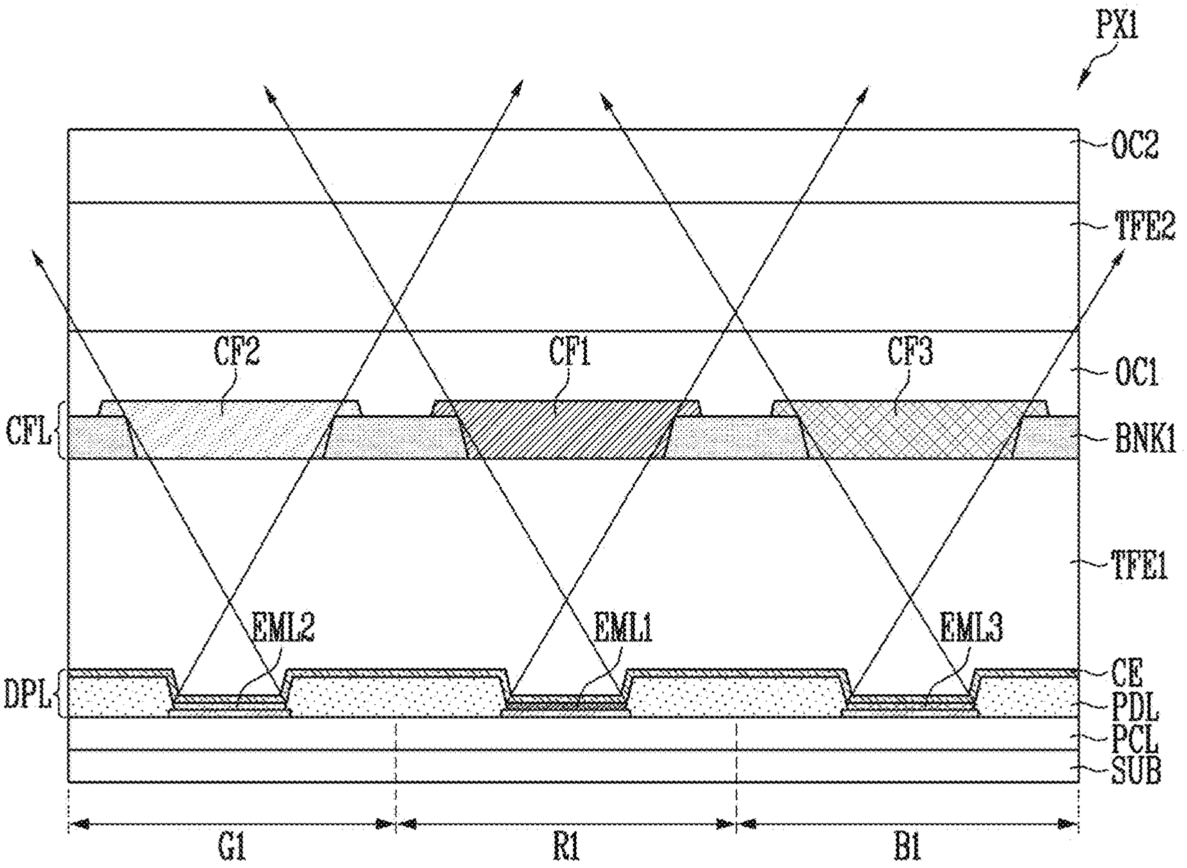
FIG. 5 is a diagram illustrating a viewing angle of a first pixel according to an embodiment of the present disclosure.

FIG. 5 is a drawing illustrating a viewing angle of a first pixel according to an embodiment.

Referring to FIG. 5, in the first pixel PX1, a viewing angle may be adjusted by the first bank BNK1. Since the viewing angle is adjusted by the first bank BNK1 close to the first to third light emitting layers EML1 to EML3 in the first pixel PX1, the first pixel PX1 may have a wide viewing angle. Therefore, as shown in FIG. 2, when the first pixel PX1 is driven, the display device 100 (refer to FIG. 1) may provide a wide viewing angle in the first mode.

FIG. 5 shows red light emitted from the first light emitting layer EML1 at a (1-1)-th viewing angle. The red light emitted from the first light emitting layer EML1 at the (1-1)-th viewing angle may contact the first bank BNK1 overlapping the first color filter CF1. The red light emitted from the first light emitting layer EML1 at a viewing angle less than the (1-1)-th viewing angle may pass through the first color filter CF1 and may be emitted to the outside. The red light emitted from the first light emitting layer EML1 at a viewing angle greater than the (1-1)-th viewing angle may be blocked by the first bank BNK1 and may not be emitted to the outside.

FIG. 5 shows green light emitted from the second light emitting layer EML2 at a (1-2)-th viewing angle. The green light emitted from the second light emitting layer EML2 at the (1-2)-th viewing angle may contact the first bank BNK1 overlapping the second color filter CF2. The green light emitted from the second light emitting layer EML2 at a viewing angle less than the (1-2)-th viewing angle may pass through the second color filter CF2 and may be emitted to the outside. The green light emitted from the second light emitting layer EML2 at a viewing angle greater than the (1-2)-th viewing angle may be blocked by the first bank BNK1 and may not be emitted to the outside.

FIG. 5 shows blue light emitted from the third light emitting layer EML3 at a (1-3)-th viewing angle. The blue light emitted from the third light emitting layer EML3 at a (1-3)-th viewing angle may contact the first bank BNK1 overlapping the third color filter CF3. The blue light emitted from the third light emitting layer EML3 at a viewing angle less than the (1-3)-th viewing angle may pass through the third color filter CF3 and may be emitted to the outside. The blue light emitted from the third light emitting layer EML3 at a viewing angle greater than the (1-3)-th viewing angle may be blocked by the first bank BNK1 and may not be emitted to the outside.

Since a size of the second light emitting layer EML2 is less than a size of the first light emitting layer EML1, the (1-1)-th viewing angle may be less than the (1-2)-th viewing angle. Since the size of the first light emitting layer EML1 is less than the size of the third light emitting layer EML3, the (1-2)-th viewing angle may be less than the (1-3)-th viewing angle.

Figure 6:
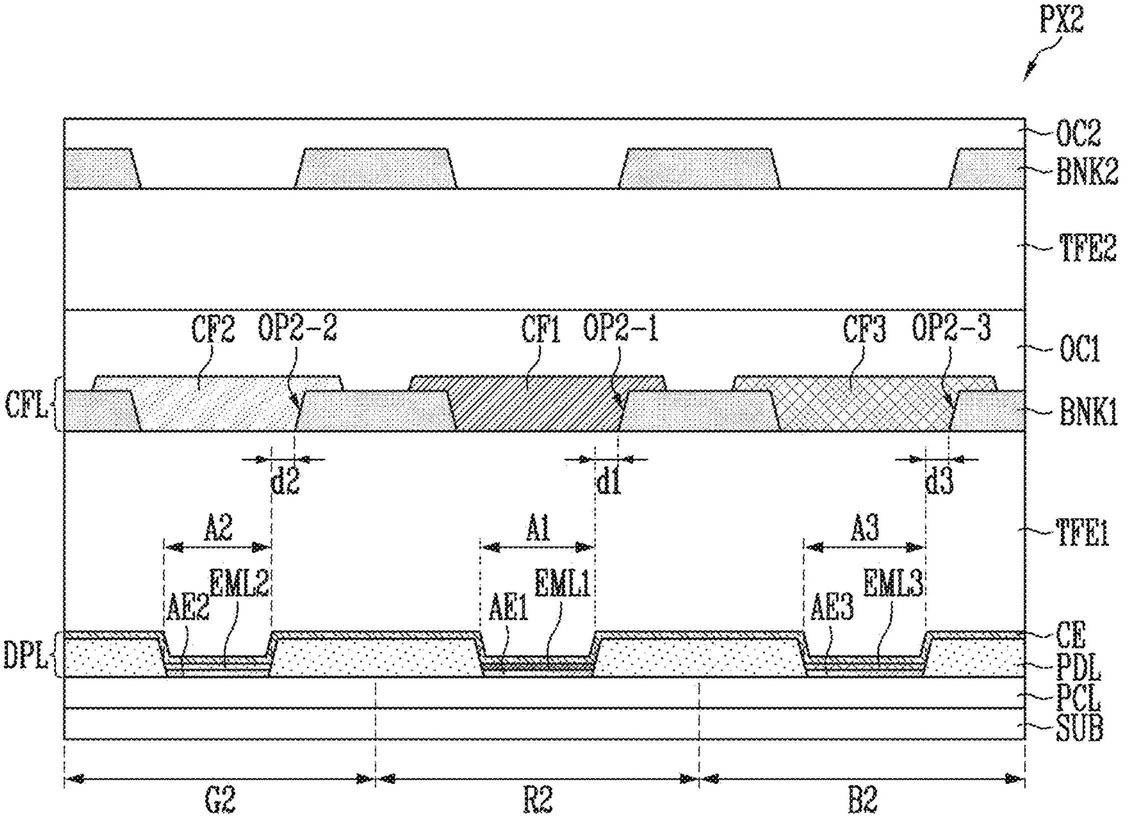
FIG. 6 is a cross-sectional view of a second pixel according to an embodiment of the present disclosure.

FIG. 6 is a cross-sectional view of a second pixel according to an embodiment. A description of a content overlapping FIG. 4 is briefly or omitted in FIG. 6, and a difference between the first pixel PX1 and the second pixel PX2 of FIG. 4 is mainly described.

Referring to FIG. 6, the first bank BNK1 may form a (2-1)-th opening OP2-1, a (2-2)-th opening OP2-2, and a (2-3)-th opening OP2-3 having different sizes. For example, a size of the (2-2)-th opening OP2-2 may be less than a size of the (2-1)-th opening OP2-1. The size of the (2-1)-th opening OP2-1 may be less than a size of the (2-3)-th opening OP2-3.

The size of the (2-1)-th opening OP2-1 may be less than the size of the (1-1)-th opening OP1-1 (refer to FIG. 4). Therefore, a first horizontal distance d1 between the first bank BNK1 and the first light emitting layer EML1 may be less in the second pixel PX2 than in the first pixel PX1 (refer to FIGS. 4 and 6). The first horizontal distance d1 may refer to the shortest distance between a line extending vertically from an end of the first light emitting layer EML1 and a line extending vertically from an end of the first bank BNK1 near the first light emitting layer EML1 when viewed in the plan view. The size of the (2-2)-th opening OP2-2 may be less than the size of the (1-2)-th opening OP1-2 (refer to FIG. 4). Therefore, a second horizontal distance d2 between the first bank BNK1 and the second light emitting layer EML2 may be less in the second pixel PX2 than in the first pixel PX1 (refer to FIGS. 4 and 6). The second horizontal distance d2 may refer to the shortest distance between a line extending vertically from an end of the second light emitting layer EML2 and a line extending vertically from an end of the first bank BNK1 near the second light emitting layer EML2 when viewed in the plan view. The size of the (2-3)-th opening OP2-3 may be less than the size of the (1-3)-th opening OP1-3 (refer to FIG. 4). Therefore, a third horizontal distance d3 between the first bank BNK1 and the third light emitting layer EML3 may be less in the second pixel PX2 than in the first pixel PX1 (refer to FIGS. 4 and 6). The third horizontal distance d3 may refer to the shortest distance between a line extending vertically from an end of the third light emitting layer EML3 and a line extending vertically from an end of the first bank BNK1 near the third light emitting layer EML3 when viewed in the plan view.

Unlike the first pixel PX1 having the first bank BNK1 only, the second pixel PX2 may further include a second bank BNK2 disposed on the second encapsulation layer TFE2. The second bank BNK2 may overlap the first bank BNK1 on the second encapsulation layer TFE2. The second bank BNK2 may include a light blocking material to control the viewing angle of the light emitted from the first to third light emitting layers EML1 to EML3. The second bank BNK2 may be formed of substantially the same material as the first bank BNK1, but embodiments are not necessarily limited thereto.

In the second pixel PX2, the first to third light emitting layers EML1 to EML3 may have different light emission areas. For example, the light emission area A2 of the second light emitting layer EML2 may be less than the light emission area A1 of the first light emitting layer EML1 when viewed in a plan view. The light emission area A1 of the first light emitting layer EML1 may be less than the light emission area A3 of the third light emitting layer EML3 when viewed in the plan view. In an embodiment, an aperture ratio of the second green sub-pixel G2 may be less than an aperture ratio of the second red sub-pixel R2, and the aperture ratio of the second red sub-pixel R2 may be less than an aperture ratio of the second blue sub-pixel B2. In an embodiment, when the second pixel PX2 includes a pair of second green sub-pixels G2, a second red sub-pixel R2, and a second blue sub-pixel B2, an aperture ratio of the pair of second green sub-pixels G2 may be less than an aperture ratio of the second red sub-pixel R2, which is less than an aperture ratio of the second blue sub-pixel B2. Even the presence of the second bank BNK2 narrowing a viewing angle compared to a viewing angle of the first pixel PX1, the relationship between the aperture ratios of the second green sub-pixel G2, the second red-sub pixel R2, and the second blue-sub pixel B2 similar to the relationship of aperture ratios in the first pixel PX1. In an embodiment, an aperture ratio of the pair of first green sub-pixels G1 and the pair of second green sub-pixels G2 may be less than an aperture ratio of the first red-sub pixel R1 and the second red-sub pixel R2, which is less than an aperture ratio of the first blue-sub pixel B1 and the second blue-sub pixel B2. In an embodiment, this aperture size relationship may be maintained in the first mode and the second mode.

Figure 7:
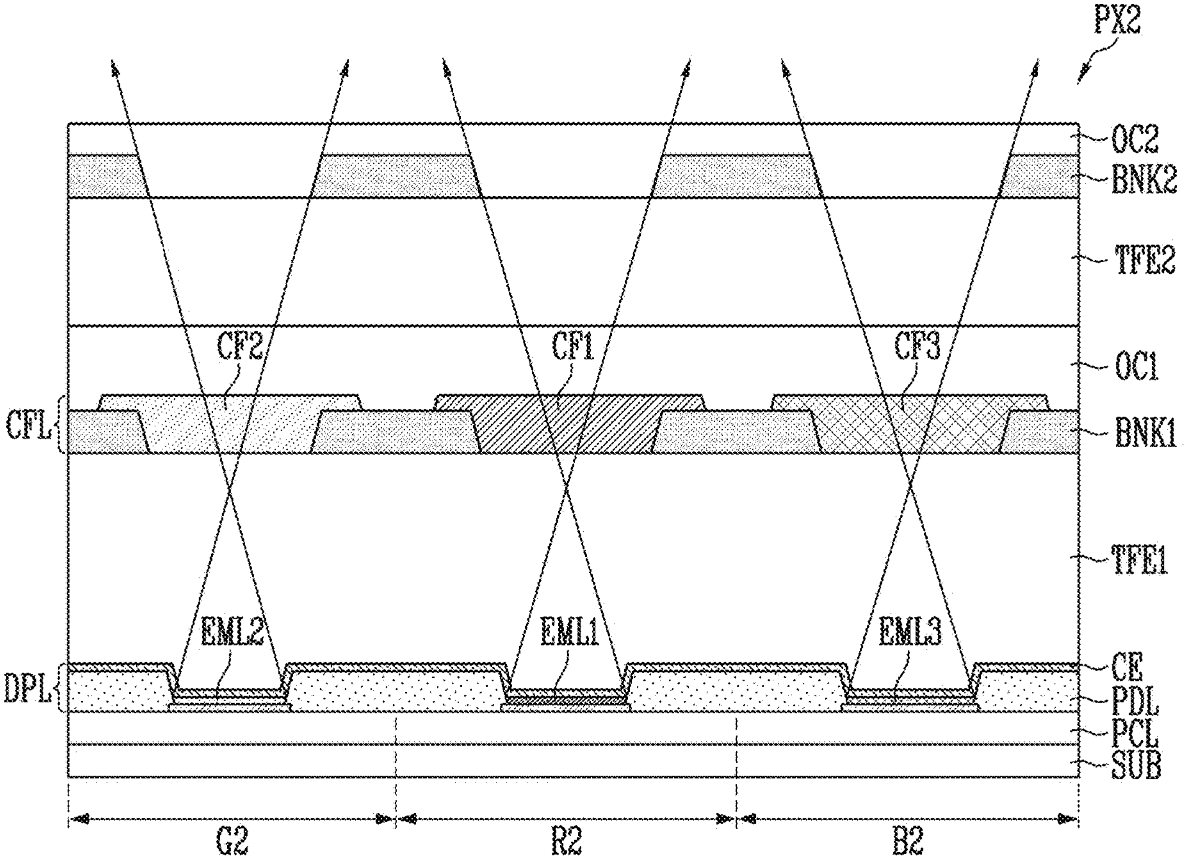
FIG. 7 is a diagram illustrating a viewing angle of a second pixel according to an embodiment of the present disclosure.

FIG. 7 is a drawing illustrating a viewing angle of a second pixel according to an embodiment.

Referring to FIG. 7, in the second pixel PX2, a viewing angle may be adjusted by the second bank BNK2. Since the viewing angle is adjusted by the second bank BNK2 far from the first to third light emitting layers EML1 to EML3 in the second pixel PX2, the second pixel PX2 may have a narrow viewing angle. Therefore, as shown in FIG. 3, when the second pixel PX2 is driven, the display device 100 (refer to FIG. 1) may provide a narrow viewing angle in the second mode.

FIG. 7 shows red light emitted from the first light emitting layer EML1 at a (2-1)-th viewing angle. The red light emitted from the first light emitting layer EML1 at the (2-1)-th viewing angle may contact the second bank BNK2. The red light emitted from the first light emitting layer EML1 at a viewing angle less than the (2-1)-th viewing angle may pass through the first color filter CF1 and may be emitted to the outside. The red light emitted from the first light emitting layer EML1 at a viewing angle greater than the (2-1)-th viewing angle may be blocked by the second bank BNK2 and may not be emitted to the outside.

FIG. 5 shows green light emitted from the second light emitting layer EML2 at a (2-2)-th viewing angle. The green light emitted from the second light emitting layer EML2 at the (2-2)-th viewing angle may contact the second bank BNK2. The green light emitted from the second light emitting layer EML2 at a viewing angle less than the (2-2)-th viewing angle may pass through the second color filter CF2 and may be emitted to the outside. The green light emitted from the second light emitting layer EML2 at a viewing angle greater than the (2-2)-th viewing angle may be blocked by the second bank BNK2 and may not be emitted to the outside.

FIG. 5 shows blue light emitted from the third light emitting layer EML3 at a (2-3)-th viewing angle. The blue light emitted from the third light emitting layer EML3 at the (2-3)-th viewing angle may contact the second bank BNK2. The blue light emitted from the third light emitting layer EML3 at a viewing angle less than the (2-3)-th viewing angle may pass through the third color filter CF3 and may be emitted to the outside. The blue light emitted from the third light emitting layer EML3 at a viewing angle greater than the (2-3)-th viewing angle may be blocked by the second bank BNK2 and may not be emitted to the outside.

Since a size of the second light emitting layer EML2 is less than a size of the first light emitting layer EML1, the (2-1)-th viewing angle may be less than the (2-2)-th viewing angle. Since the size of the first light emitting layer EML1 is less than a size of the third light emitting layer EML3, the (2-2)-th viewing angle may be less than the (2-3)-th viewing angle.

Figure 8:
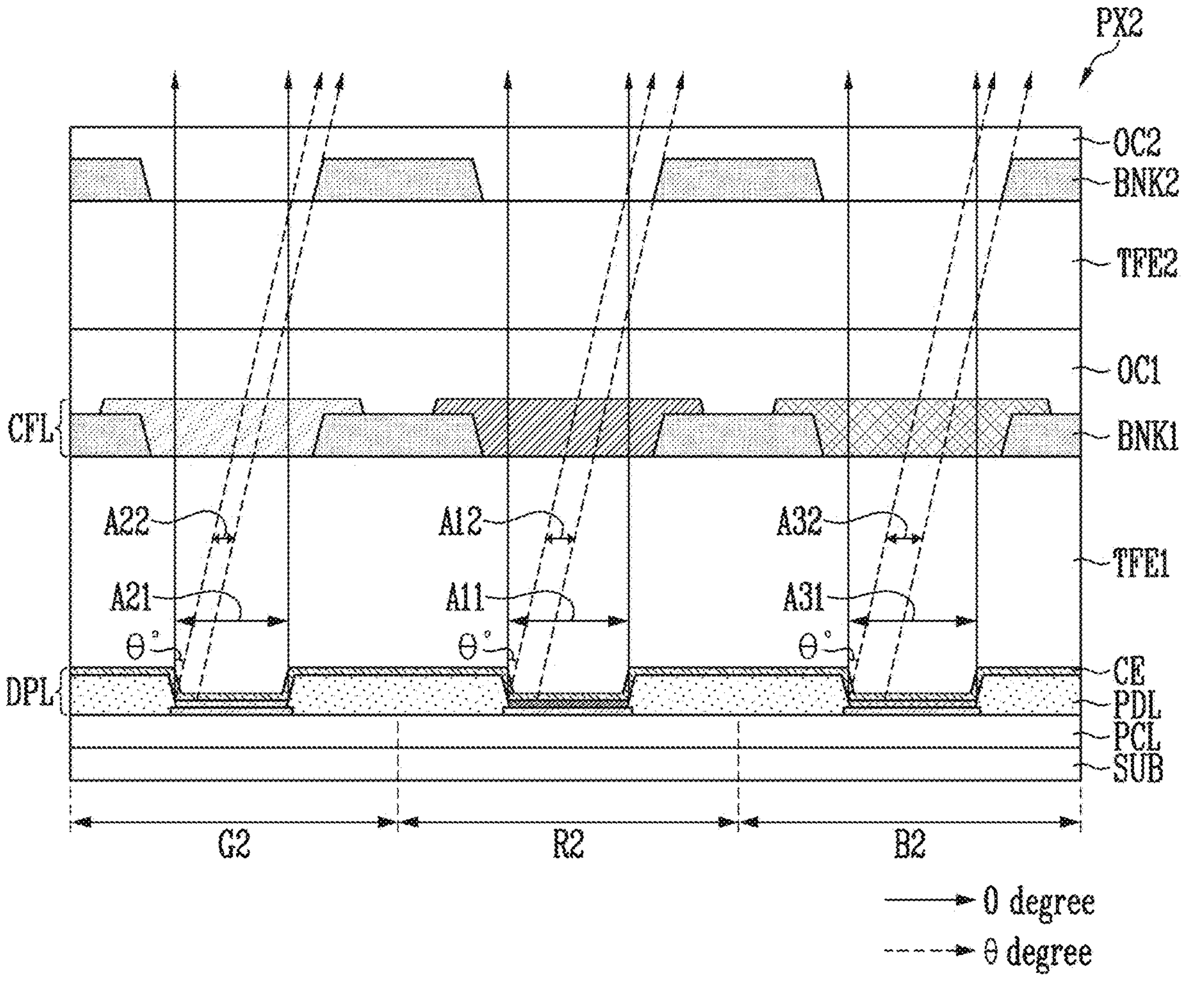
FIG. 8 is a diagram illustrating a luminance change of a second pixel according to a viewing angle according to an embodiment of the present disclosure.

FIG. 8 is a drawing illustrating a luminance change of a second pixel according to a viewing angle according to an embodiment.

Referring to FIG. 8, when a viewing angle is small, a luminance difference may not exist between lights emitted from the first to third light emitting layers EML1 to EML3. For example, when the viewing angle is θ°, the light output area A11 of the first light emitting layer EML1 may be equal to the light emission area A1 (refer to FIG. 6), the light output area A21 of the second light emitting layer EML2 may be equal to the light emission area A2 (refer to FIG. 6), and the light output area A31 of the third light emitting layer EML3 may be equal to the light emission area A3 (refer to FIG. 6). Therefore, all of the red light, the green light, and the blue light may have the same luminance (or brightness), for example, 100% luminance.

When the viewing angle is large, a luminance difference may exist between the lights emitted from the first to third light emitting layers EML1 to EML3. For example, when the viewing angle is θ°, the light output area A12 of the first light emitting layer EML1 may be less than the light emission area A1, the light output area A22 of the second light emitting layer EML2 may be less than the light emission area A2, and the light output area A32 of the third light emitting layer EML3 may be less than the light emission area A3. Therefore, a luminance of red light, a luminance of green light, and a luminance of blue light may decrease. At this time, since the light emission area A2 of the second light emitting layer EML2 is the least, the light output area A22 of the second light emitting layer EML2 may be the least, and thus a luminance decrease of the green light may be the greatest. Therefore, in the second mode in which the second pixel PX2 is driven, an image observed at a high viewing angle may be reddish, and thus display quality may be deteriorated.

In FIG. 8, θ° may refer to a high viewing angle when the luminance of the green light decreases and the image appears reddish. For example, θ° may be 50° or more, but embodiments are not necessarily limited thereto. For example, θ° may be changed according to the size of the first to third light emitting layers EML1 to EML3 or the size of the second bank BNK2.

Figure 9:
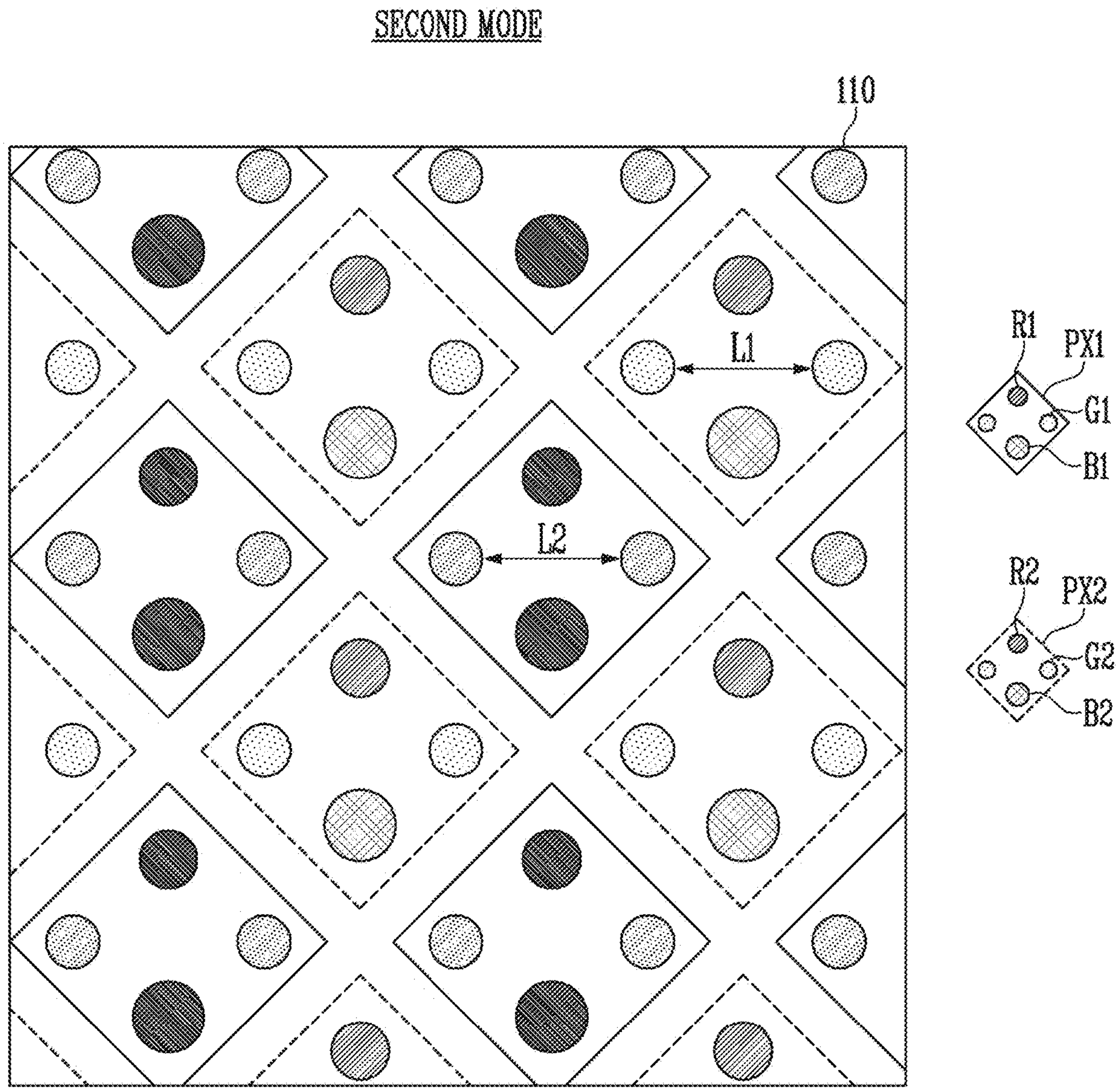
FIG. 9 is a diagram illustrating a second mode of a display device according to an embodiment of the present disclosure.

FIG. 9 is a drawing illustrating a second mode of a display device according to an embodiment.

Referring to FIG. 9, in the second mode of the display device 100 (refer to FIG. 1), not only the second pixels PX2 but also the first pixels PX1 may be driven. For example, in the second mode, the first green sub-pixels G1 of the second pixels PX2 and the first pixels PX1 may be driven. In the second mode, the first red sub-pixels R1 and the first blue sub-pixels B1 of the first pixels PX1 may not be driven. That is, the first red sub-pixels R1 and the first blue sub-pixels B1 may display a black image. For example, in the second mode, the controller 140 may control the data driver 130 using the second data control signal DCS2 such that the first red sub-pixels R1 and the first blue sub-pixels B1 stay off and appear completely black while the other pixels driven emit lights. In an embodiment, in the second mode, the scan driver may supply the scan signals SS to all pixels like in the first mode, but the data driver 130 may selectively turn off the first red sub-pixels R1 and the first blue sub-pixels B1. The data signal DS generated by the data driver 130 does not supply voltage to the first red sub-pixels R1 and the blue sub-pixels B1. A viewing angle of the first green sub-pixels G1 may be greater than a viewing angle of the second green sub-pixels G2. Therefore, a luminance decrease of green light emitted from the second green sub-pixels G2 at a high viewing angle may be offset by green light emitted from the first green sub-pixels G1. In other words, a green luminance of the image displayed on the display panel 110 may increase at a high viewing angle. Therefore, reddish of an image observed at a high viewing angle in the second mode may be prevented, and thus display quality may be increased.

In the second mode, the second green sub-pixels G2 may be driven with a first luminance L1, and the first green sub-pixels G1 may be driven with a second luminance L2 lower than the first luminance L1. A sum of the first luminance L1 and the second luminance L2 may be equal to a luminance of the first green sub-pixels G1 and the second green sub-pixels G2 driven in the first mode. That is, a luminance of the second green sub-pixels G2 may be lower in the second mode than in the first mode. For example, in the first mode, the first green sub-pixels G1 and the second green sub-pixels G2 may be driven with 100% luminance to maintain a frontal luminance (luminance when a viewing angle is 0°) constant. For example, in the second mode, the second green sub-pixels G2 may be driven with 95% luminance, and the first green sub-pixels G1 may be driven with 5% luminance. Accordingly, a front luminance may be maintained constant even in the second mode.

FIGS. 10 to 13 are drawings illustrating an operation principle of a second mode of a display device according to an embodiment.

Referring to FIGS. 10 to 13, it will be described how to set a ratio of a luminance of the second green sub-pixels G2 and a luminance of the first green sub-pixels G1 in the second mode.

Figure 10:
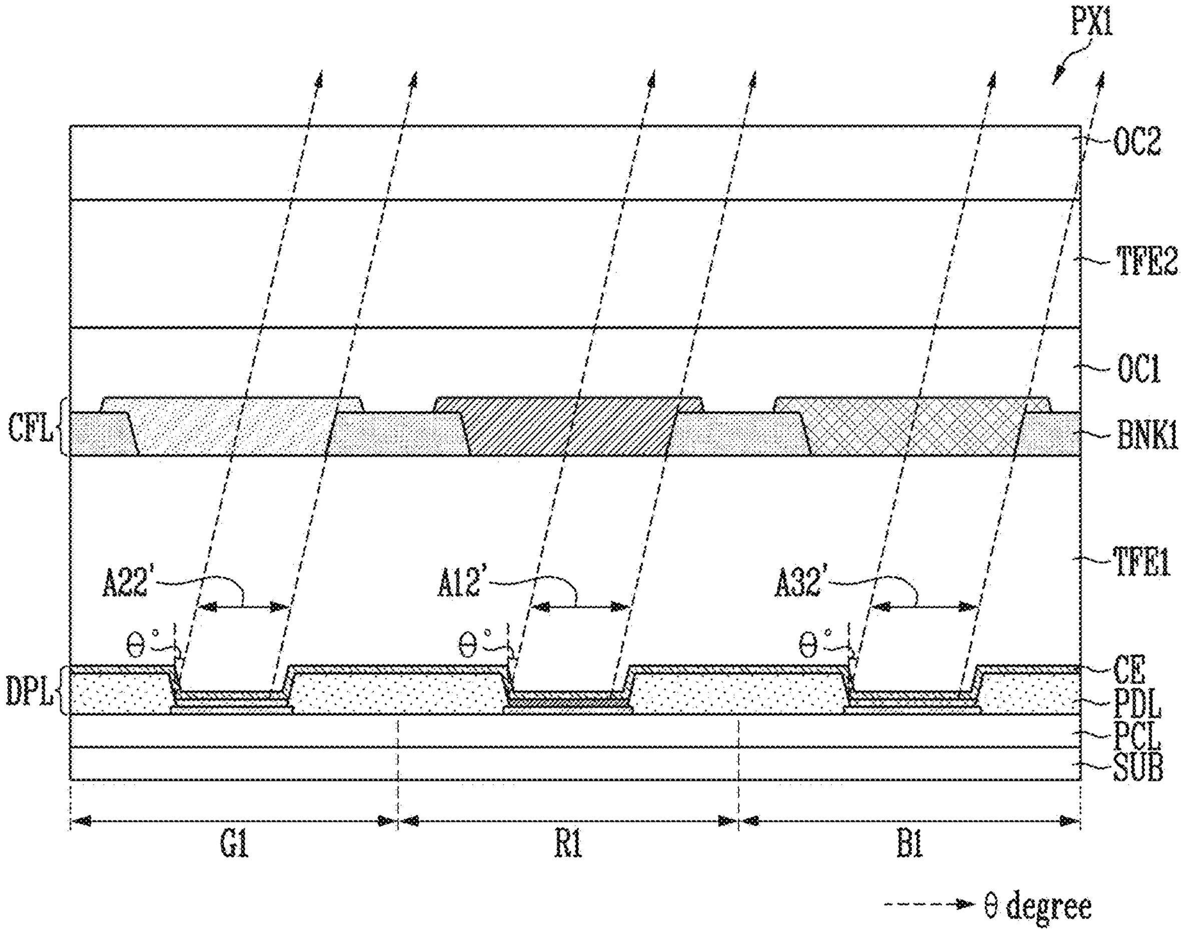

Referring to FIG. 10, a ratio of a luminance of the red light output from the first red sub-pixel R1, a luminance of the green light output from the first green sub-pixel G1, and a luminance of the blue light output from the first blue sub-pixel B1 is calculated when the viewing angle is θ. The luminance of the red light output from the first red sub-pixel R1 when the viewing angle is θ° is proportional to a ratio of the light emission area A1 (refer to FIG. 4) to the light output area A12'. The luminance of the green light output from the first green sub-pixel G1 when the viewing angle is θ° is proportional to a ratio of the light emission area A2 (refer to FIG. 4) to the light output area A22'. The luminance of the blue light output from the first blue sub-pixel B1 when the viewing angle is θ° is proportional to a ratio of the light emission area A3 (refer to FIG. 4) to the light output area A32'. In summary, the ratio of the luminance of the red light output from the first red sub-pixel R1, the luminance of the green light output from the first green sub-pixel G1, and the luminance of the blue light output from the first blue sub-pixel B1 when the viewing angle is θ° may be (A12'/A1):(A22'/A2):(A32'/A3).

Figure 11:
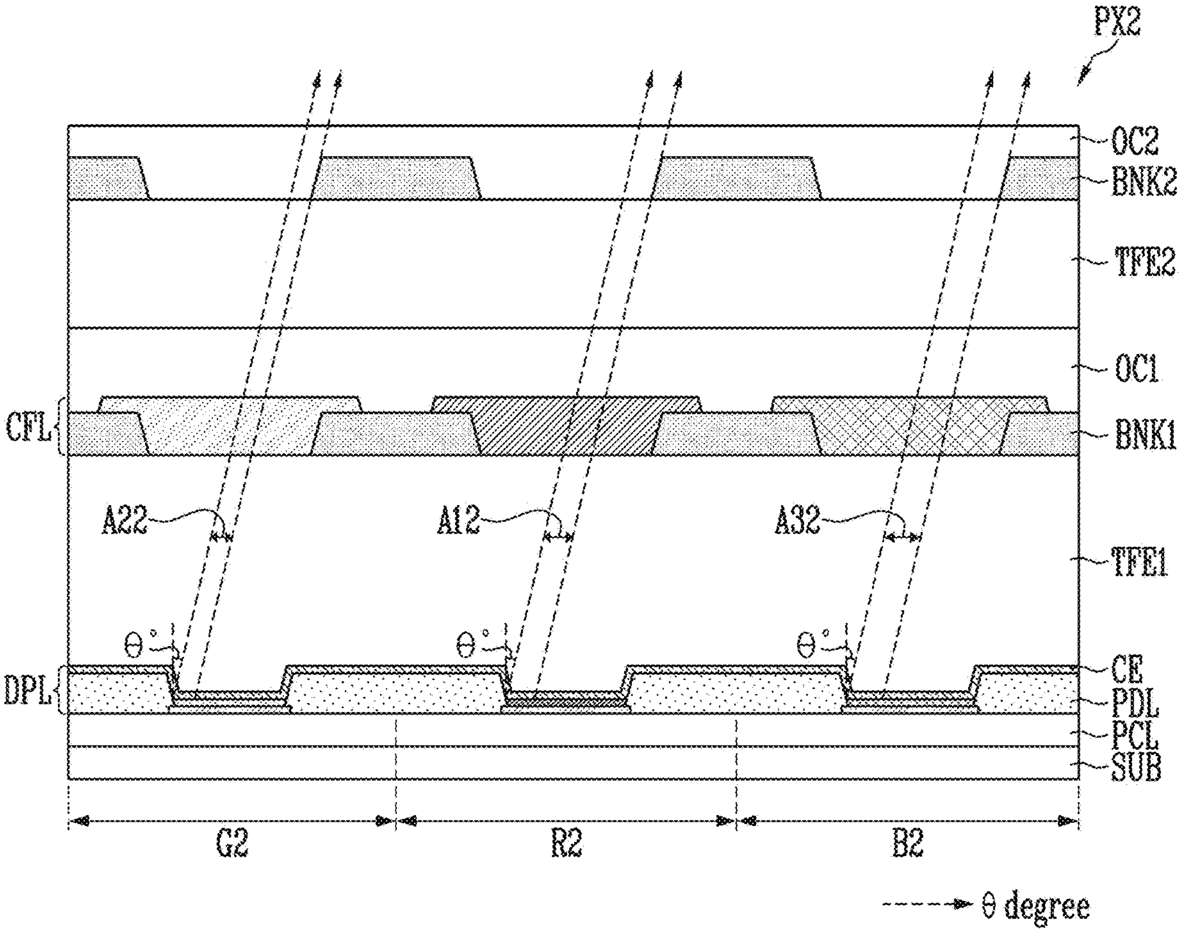

Referring to FIG. 11, a ratio of a luminance of the red light output from the second red sub-pixel R2, a luminance of the green light output from the second green sub-pixel G2, and a luminance of the blue light output from the second blue sub-pixel B2 when the viewing angle is θ° is calculated. The luminance of the red light output from the second red sub-pixel R2 when the viewing angle is θ° is proportional to a ratio of the light emission area A1 to the light output area A12. The luminance of the green light output from the second green sub-pixel G2 when the viewing angle is θ° is proportional to a ratio of the light emission area A2 to the light output area A22. The luminance of the blue light output from the second blue sub-pixel B2 when the viewing angle is θ° is proportional to a ratio of the light emission area A3 to the light output area A32. In summary, the ratio of the luminance of the red light output from the second red sub-pixel R2 when the viewing angle is θ°, the luminance of the green light output from the second green sub-pixel G2, and the luminance of the blue light output from the second blue sub-pixel B2 when the viewing angle is θ° may be (A12/A1):(A22/A2):(A32/A3).

FIG. 12 exemplarily shows a ratio LOR of the light emission area to the light output area for each sub-pixel when the viewing angle θ° is 60°. In an embodiment, the ratio LOR cumulated over the entire viewing angles may correspond to the aperture ratio.

Referring to FIG. 12, when the viewing angle θ° is 60°, a ratio of the light emission area A1 (refer to FIG. 4) to the light output area A12' (refer to FIG. 10) of the first red sub-pixel R1 of the first pixel PX1 may be 89%. When the viewing angle θ° is 60°, a ratio of the light emission area A2 (refer to FIG. 4) to the light output area A22' (refer to FIG. 10) of the first green sub-pixel G1 of the first pixel PX1 may be 89%. When the viewing angle θ° is 60°, a ratio of the light emission area A3 (refer to FIG. 4) to the light output area A32' (refer to FIG. 10) of the first blue sub-pixel B1 of the first pixel PX1 may be 90%. Therefore, when the viewing angle is 60°, a ratio of the luminance of the red light output from the first red sub-pixel R1, the luminance of the green light output from the first green sub-pixel G1, and the luminance of the blue light output from the first blue sub-pixel B1 may be 1.00:1.00:1.01.

When the angle θ° is 60°, a ratio of the light emission area A1 to the light output area A12 (refer to FIG. 11) in the second red sub-pixel R2 of the second pixel PX2 may be 67%. When the viewing angle θ° is 60°, a ratio of the light emission area A2 to the light output area A22' (refer to FIG. 11) in the second green sub-pixel G2 of the second pixel PX2 may be 65%. When the viewing angle θ° is 60°, a ratio of the light emission area A3 to the light output area A32' (refer to FIG. 11) in the second blue sub-pixel B2 of the second pixel PX2 may be 68%. Therefore, when the viewing angle is 60°, a ratio of the luminance of the red light output from the second red sub-pixel R2, the luminance of the green light output from the second green sub-pixel G2, and the luminance of the blue light output from the second blue sub-pixel B2 may be 1.00:0.97:1.01.

Figure 13:
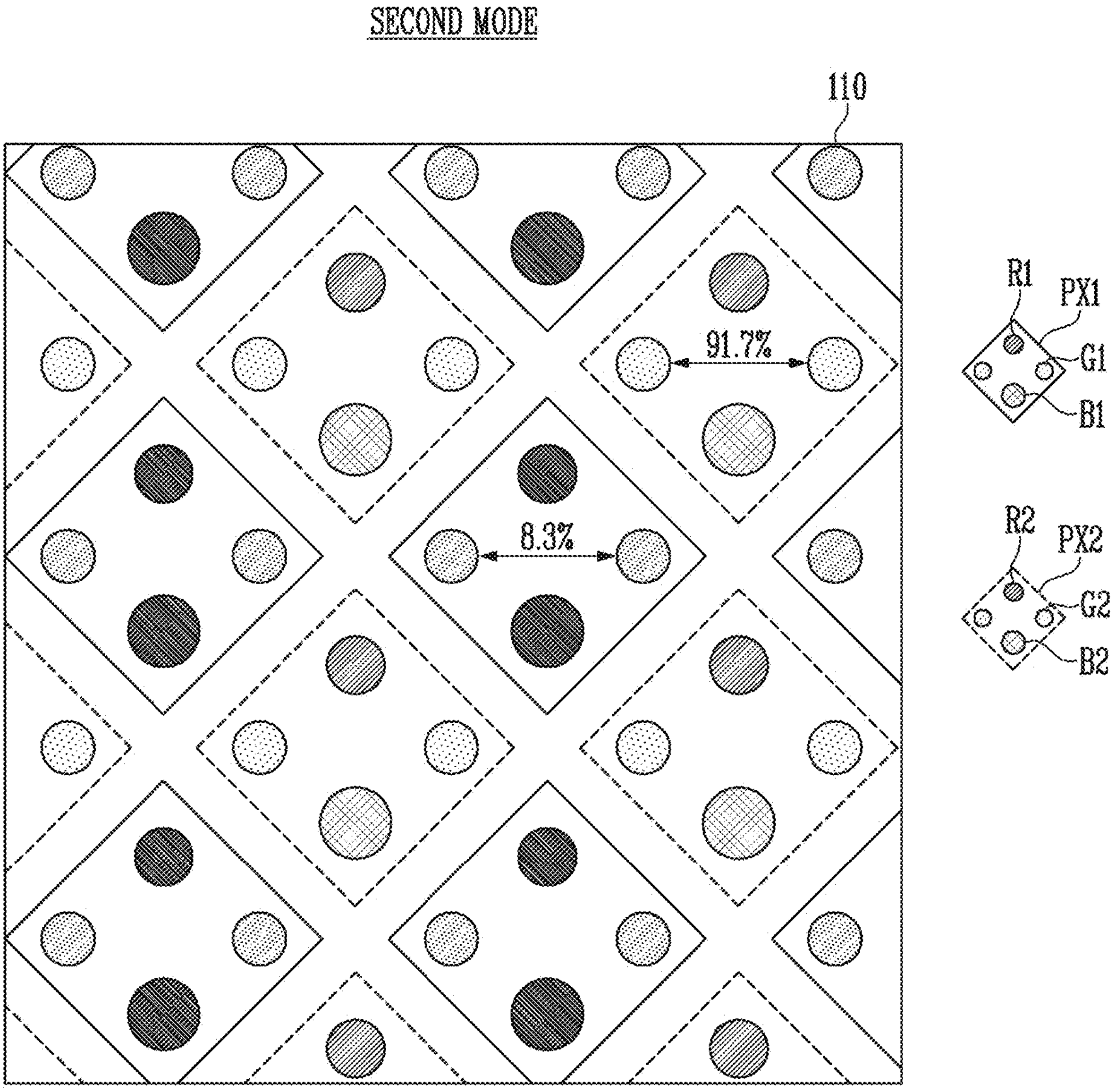

Referring to FIG. 13, in the second mode, the luminance L2 (refer to FIG. 9) of the first green sub-pixels G1 may be set to a value so that a ratio of the luminance of the red light output from the second red sub-pixels R2, the luminance of the green light output from the first green sub-pixels G1 and the second green sub-pixels G2, and the luminance of the blue light output from the second blue sub-pixels B2 when the viewing angle is 60° is equal to a ratio of the luminance of the red light output from the first red sub-pixels R1, the luminance of the green light output from the first green sub-pixels G1, and the luminance of the blue light output from the first blue sub-pixels B1 when the viewing angle is 60° (that is, 1.00:1.00:1.01).

Referring to FIG. 12, green light of a luminance of 2% is further required so that the ratio of the luminance of the red light output from the second red sub-pixel R2, the luminance of the green light output from the second green sub-pixel G2, and the luminance of the blue light output from the second blue sub-pixel B2 (that is, 1.00:0.97:1.01) becomes 1.00:1.00:1.01. This is supplemented by the green light emitted from the first green sub-pixels G1 having a wide viewing angle in the second mode. To this end, the first green sub-pixels G1 may be driven by setting a luminance to 8.3%(=(((0.67-0.65)/(0.89-0.65))*100%)), and the second green sub-pixels G2 may be driven by setting a luminance to 91.7%. Therefore, while a front luminance may be maintained at 100%, even though the viewing angle θ° (refer to FIG. 11) is large, a green luminance of the image displayed on the display panel 110 in the second mode may increase, and thus display quality may be increased.

Figure 14:
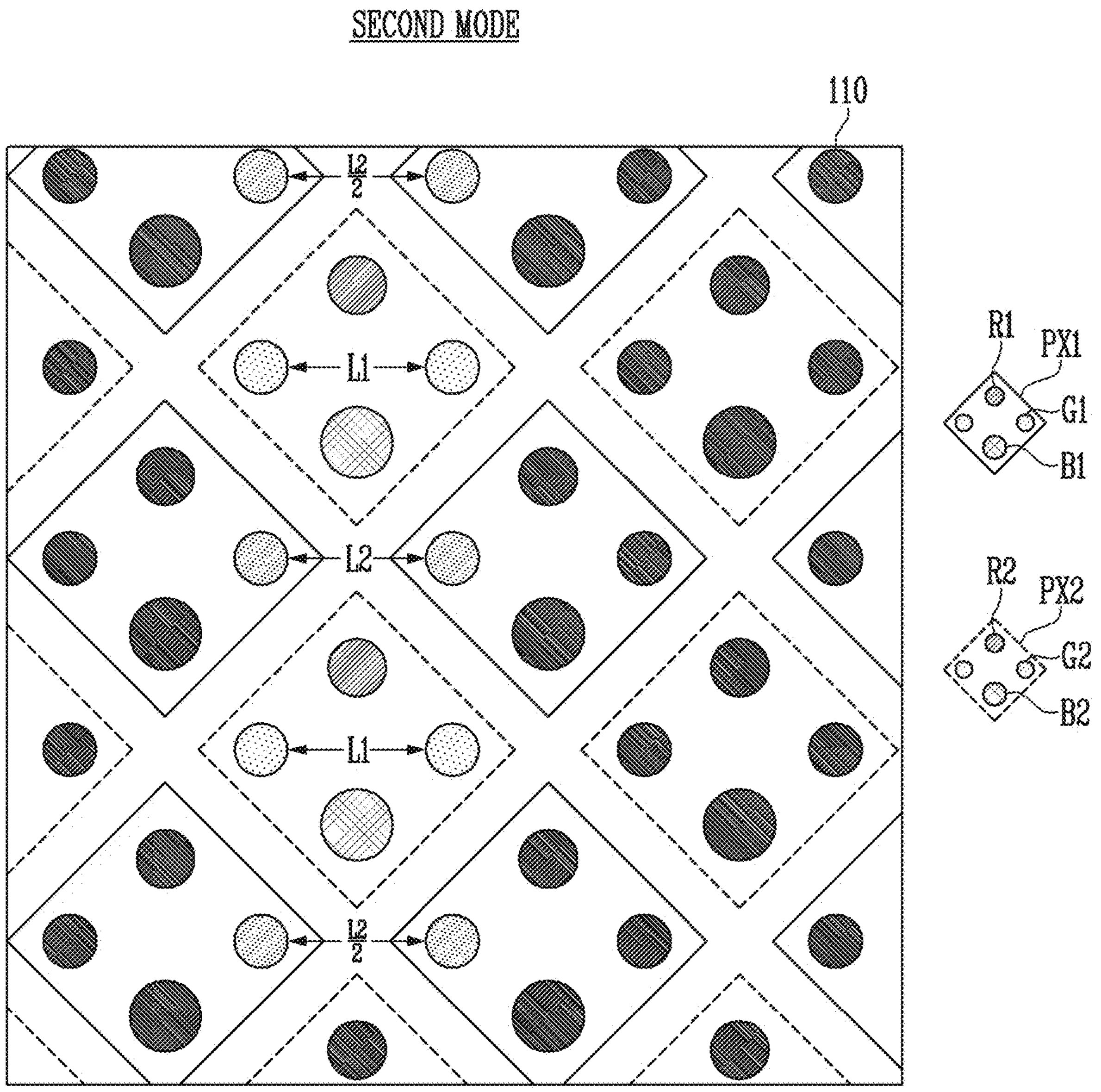
FIGS. 14 to 16 are drawings illustrating a second mode of a display device according to embodiments of the present disclosure.
Figure 15:
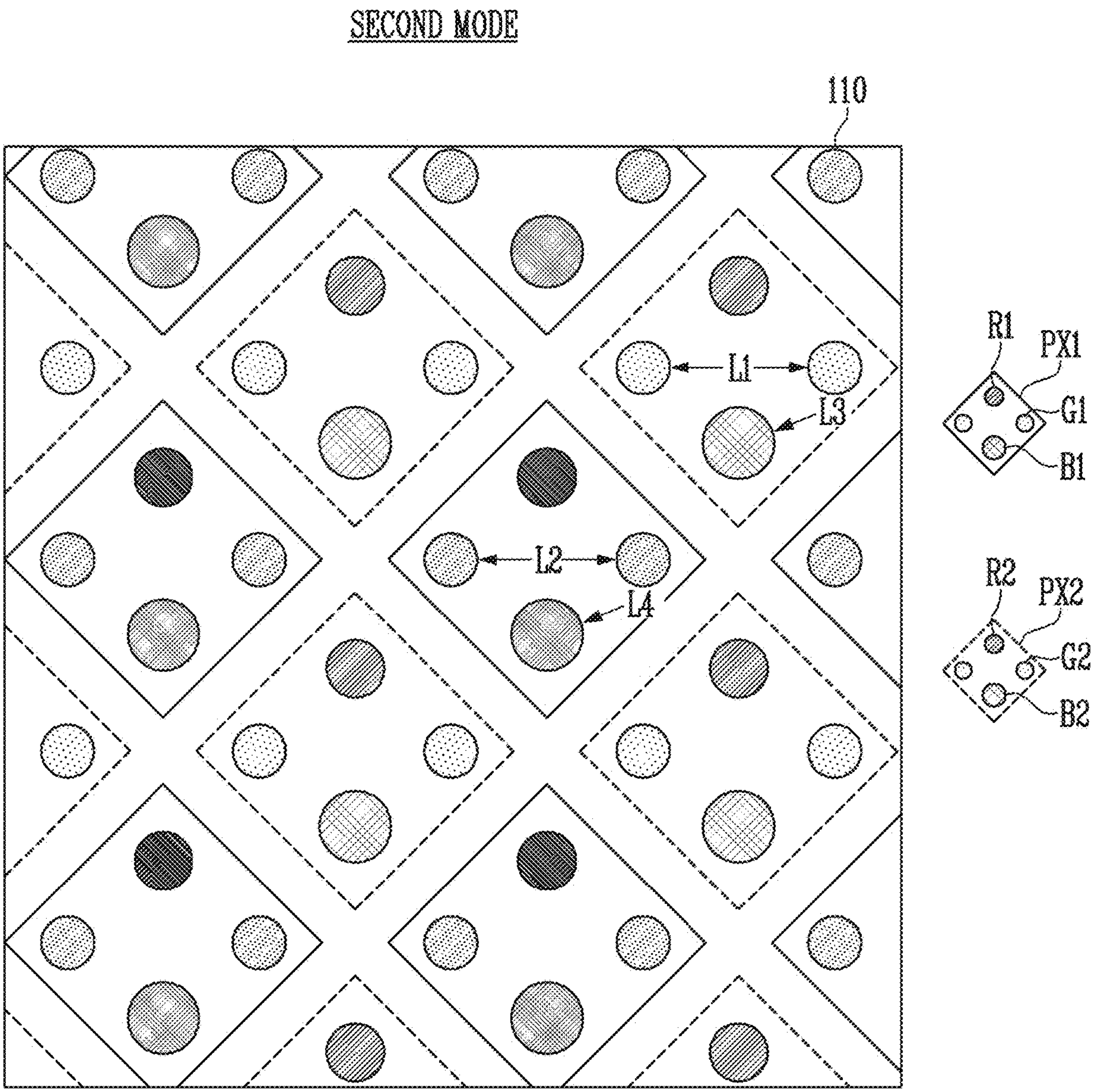
Figure 16:
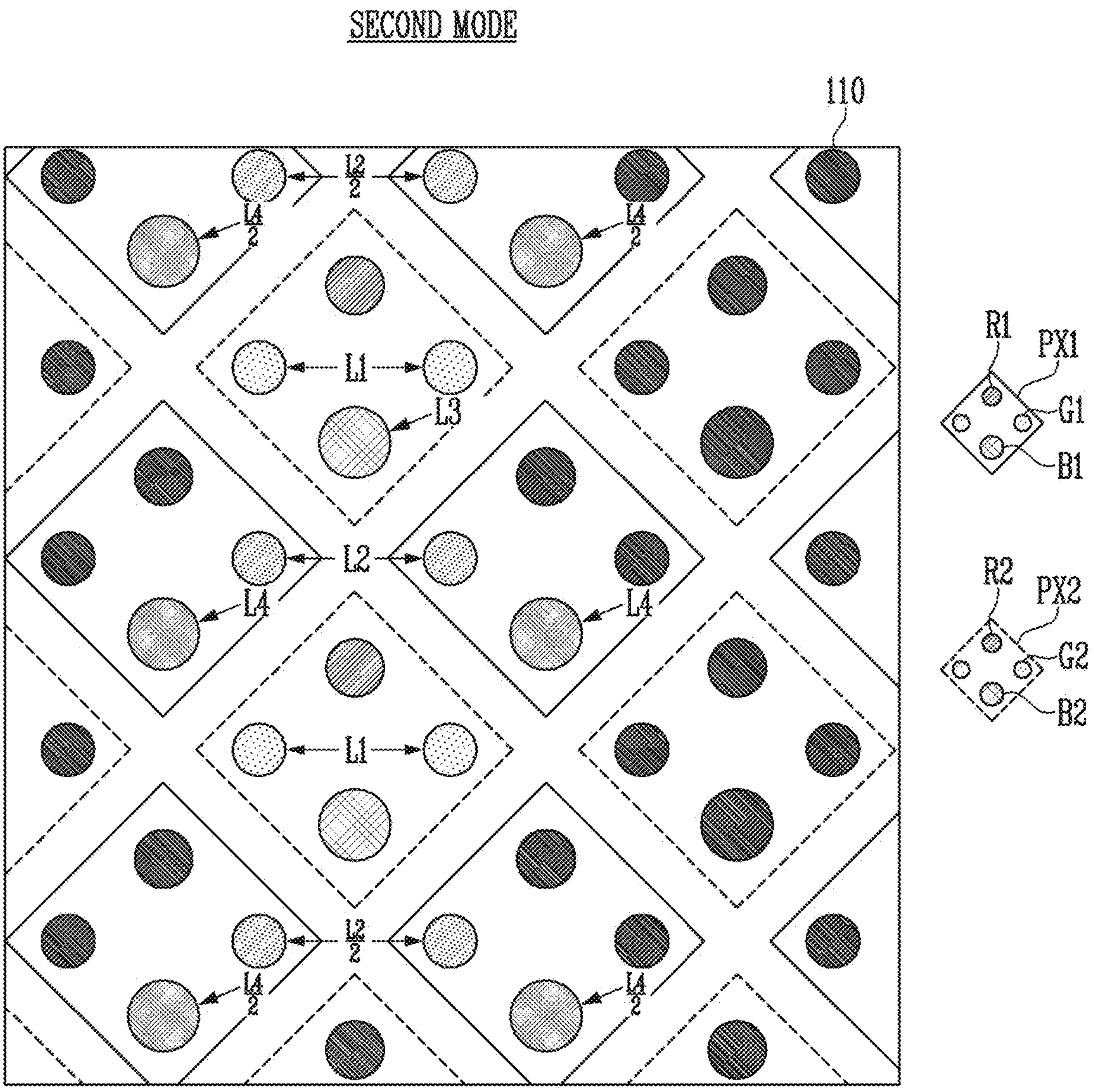

FIGS. 14 to 16 are drawings illustrating a second mode of a display device according to embodiments.

Referring to FIG. 14, in the second mode, only some of the second pixels PX2 may be driven according to the image, and the rest may not be driven. Only some of the first pixels PX1 may be driven, and the rest may not be driven. In this case, the first pixels PX1 adjacent to the driven some of the second pixels PX2 may be driven. For example, the first green sub-pixels G1 adjacent to the driven some of the second pixels PX2 may be driven. At this time, all of the first green sub-pixels G1 adjacent to the driven some of the second pixels PX2 may be driven with the second luminance L2. The first green sub-pixels G1 adjacent to one of the driven some of the second pixels PX2 may be driven at half the second luminance L2 (L2/2). Therefore, even though the second pixels PX2 are partially driven in the second mode, a front luminance may be maintained at 100%, and even though the viewing angle θ° (refer to FIG. 11) is large, a green luminance of the image displayed on the display panel 110 in the second mode may increase, and thus display quality may be increased.

Referring to FIG. 15, in the second mode, not only the first green sub-pixels G1 but also the first blue sub-pixels B1 may be driven. When the first blue sub-pixels B1 are further driven, visibility of the blue light may increase when the viewing angle θ° (refer to FIG. 11) is large. Accordingly, a degree to which the image is reddish at a high viewing angle may be decreased, and thus display quality may be further increased.

In the second mode, a luminance L4 of the first blue sub-pixels B1 may be set to a value so that a ratio of the luminance of the red light output from the second red sub-pixels R2, the luminance of the green light output from the first green sub-pixels G1 and the second green sub-pixels G2, and the luminance of the blue light output from the first blue sub-pixels B1 and the second blue sub-pixels B2 when the viewing angle θ° is large is equal to a ratio of the luminance of the red light output from the first red sub-pixels R1, the luminance of the green light output from the first green sub-pixels G1, and the luminance of the blue light output from the first blue sub-pixels B1 when the viewing angle θ° is large. A luminance L3 of the second blue sub-pixels B2 may be changed according to the luminance L4 of the first blue sub-pixels B1. For example, the luminance L3 of the second blue sub-pixels B2 may be set to a value obtained by subtracting the luminance L4 of the first blue sub-pixels B1 from 100%. The luminance L4 of the first blue sub-pixels B1 may be set in a method the same as the method of setting the luminance L2 of the first green sub-pixels G1 as described with reference to FIGS. 12 and 13, and thus a detailed description thereof is omitted.

Referring to FIG. 16, the first blue sub-pixels B1 adjacent to the driven some of the second pixels PX2 in the second mode may be driven. At this time, all of the first blue sub-pixels B1 adjacent to the driven some of the second pixels PX2 may be driven with the fourth luminance L4. The first blue sub-pixels B1 adjacent to one of the driven some of the second pixels PX2 may be driven at half the fourth luminance L4 (L4/2). Therefore, even though the second pixels PX2 are partially driven in the second mode, a front luminance may be maintained at 100%, and even though the viewing angle θ° is large, the green and blue luminance of the image displayed on the display panel 110 in the second mode may increase, and thus display quality may be further increased.

Figure 17:
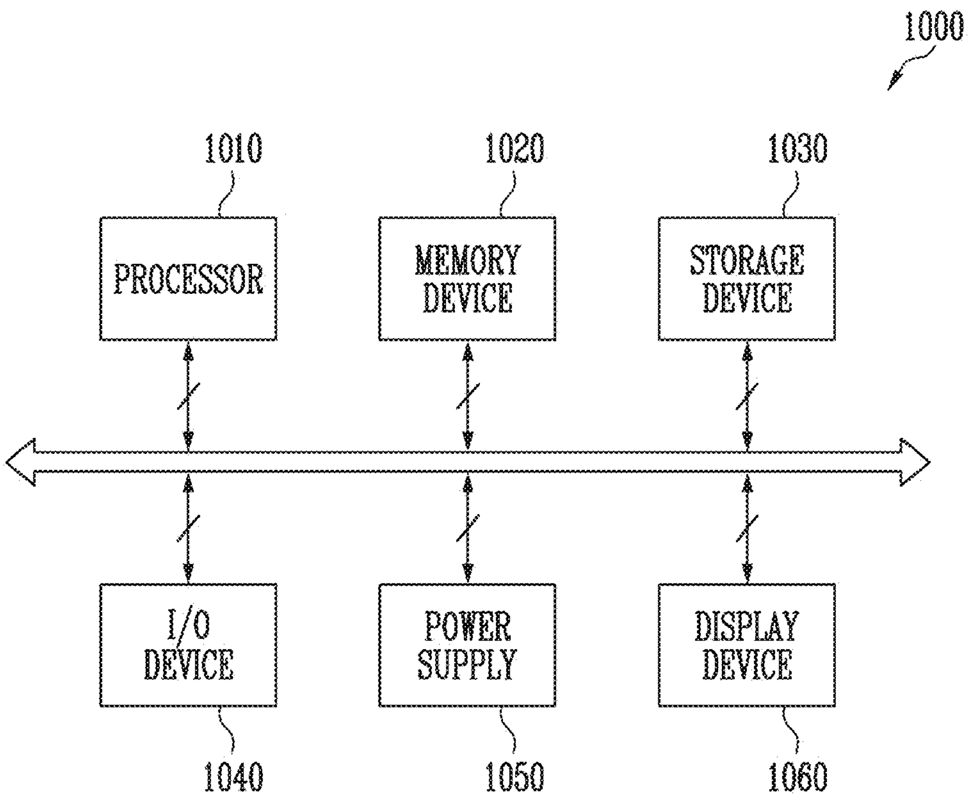
FIG. 17 is a schematic block diagram illustrating an electronic device including a display device in accordance with an embodiment of the present disclosure.
Figure 18:
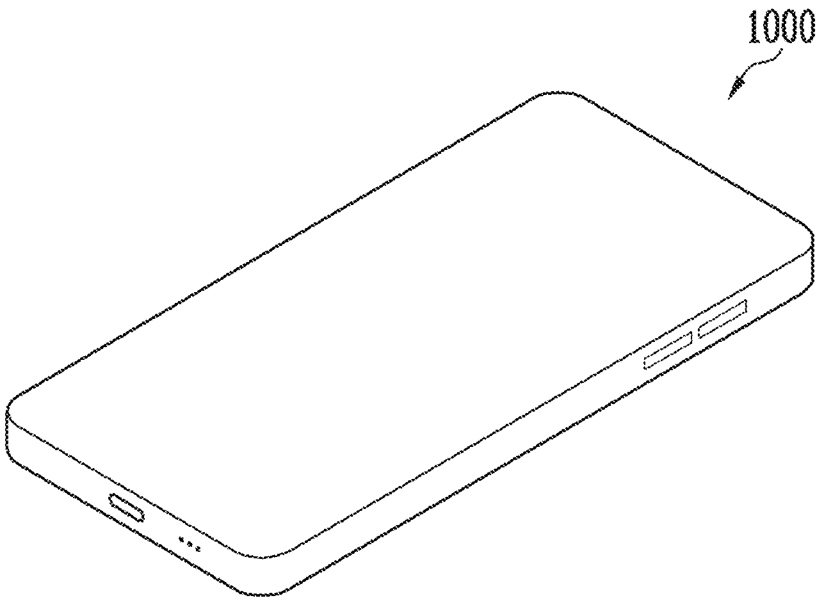
FIG. 18 is a schematic diagram illustrating an example where the electronic device of FIG. 17 is a smartphone according to an embodiment of the present disclosure.
Figure 19:
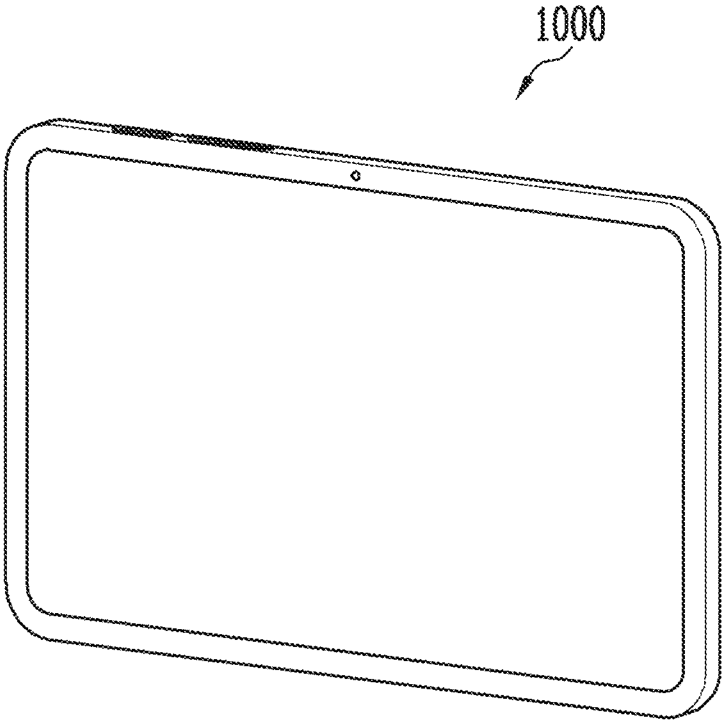
FIG. 19 is a schematic diagram illustrating an example where the electronic device of FIG. 17 is a tablet computer according to an embodiment of the present disclosure.

FIG. 17 is a schematic block diagram illustrating an electronic device 1000 including a display device in accordance with an embodiment. FIG. 18 is a schematic diagram illustrating an example where the electronic device 1000 of FIG. 17 is a smartphone. FIG. 19 is a schematic diagram illustrating an example where the electronic device 1000 of FIG. 17 is a tablet computer.

Referring to FIGS. 17 to 19, the electronic device 1000 may include a processor 1010, a memory device 1020, a storage device 1030, an input/output (I/O) device 1040, a power supply 1050, and a display device 1060. The display device 1060 may be the display device 100 of FIG. 1. The electronic device 1000 may further include various ports for communication with a video card, a sound card, a memory card, a USB device, or other systems. In an embodiment, as illustrated in FIG. 18, the electronic device 1000 may be a smartphone. In an embodiment, as illustrated in FIG. 19, the electronic device 1000 may be a tablet computer. However, the aforementioned examples are illustrative, and the electronic device 1000 is not necessarily limited to the aforementioned examples. For example, the electronic device 1000 may be a cellular phone, a video phone, a smart pad, a smartwatch, a navigation device for vehicles, a computer monitor, a laptop computer, or a head-mounted display device.

The processor 1010 may perform specific calculations or tasks. In an embodiment, the processor 1010 may be a microprocessor, a central processing unit, or an application processor. The processor 1010 may be connected to other components through an address bus, a control bus, or a data bus. In an embodiment, the processor 1010 may be connected to an expansion bus such as a peripheral component interconnect (PCI) bus. In an embodiment, the processor 1010 may provide input image data to the display device 1060. Hence, the display device 1060 may display an image based on the input image data provided from the processor 1010.

The memory device 1020 may store data needed to perform the operation of the electronic device 1000. The memory device 1020 may function as a working memory and/or a buffer memory for the processor 1010. For example, the memory device 1020 may include one or more volatile memory devices such as a dynamic random access memory (DRAM) device, a static random access memory (SRAM) device, and a mobile DRAM device.

The storage device 1030 may store data in response to control signals or data from the processor 1010. The storage device 1030 may include one or more non-volatile storages to retain the data even when the electronic device 1000 is powered off. In some embodiments, the storage device 1030 may include a solid state drive (SSD), a hard disk drive (HDD), or a CD-ROM.

The I/O device 1040 may include input devices such as a keyboard, a keypad, a touchpad, a touch screen, and a mouse, and output devices such as a speaker and a printer. In an embodiment, the display device 1060 may be integrated with the I/O device 1040.

The power supply 1050 may supply power needed to perform the operation of the electronic device 1000. For example, the power supply 1050 may include a power management integrated circuit (PMIC). In an embodiment, the power supply 1050 may supply power to the display device 1060.

The display device 1060 may display images in response to control signals or data from the processor 1010. The display device 1060 may be connected to other components through the buses or other communication links.

Figure 20:
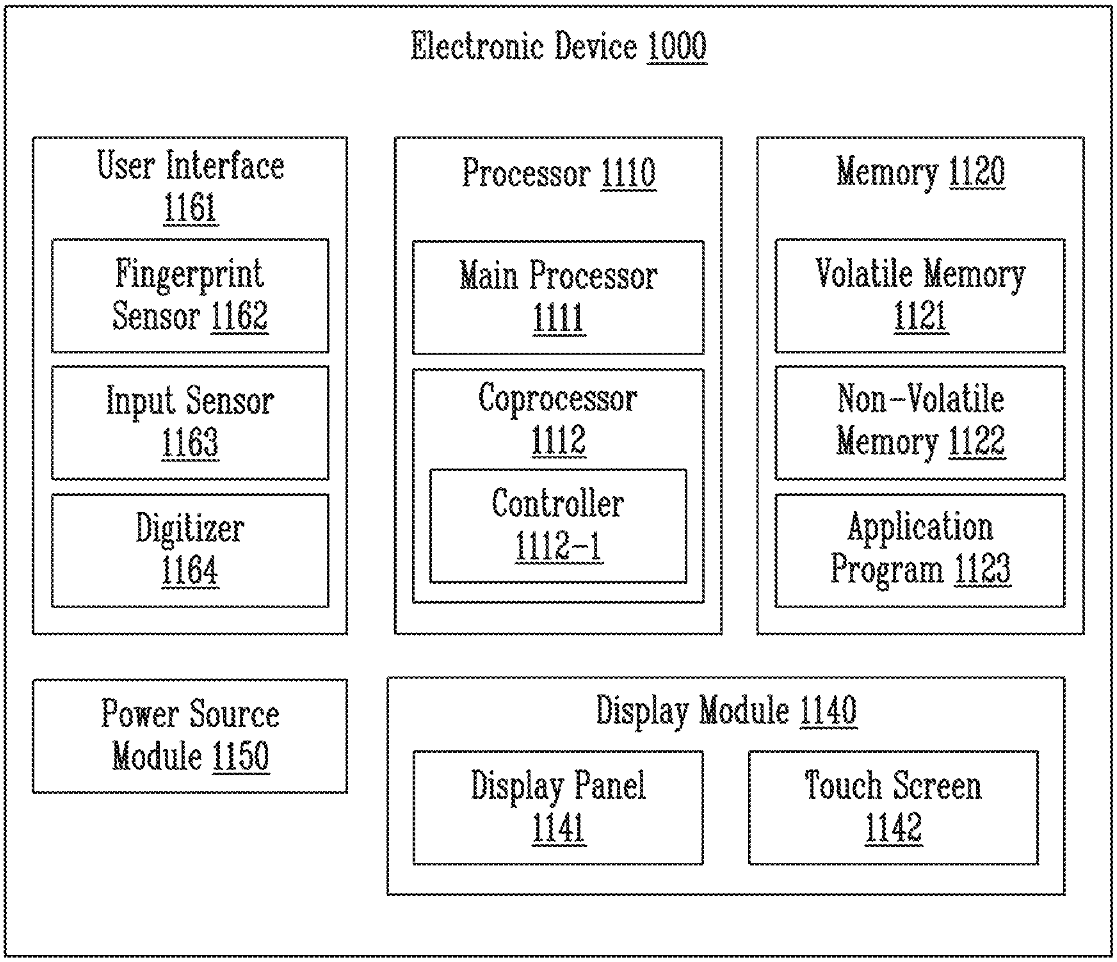
FIG. 20 is a block diagram illustrating an electronic device according to an embodiment.

FIG. 20 is a diagram illustrating an electronic device according to an embodiment of the present invention. Referring to FIG. 10, the electronic device 1000 according to one embodiment of the present invention may output various information (e.g., images, text, music, etc.) through a display module 1140, which, for example, may correspond to the display device shown in FIG. 1. When a processor 1110 executes an application stored in a memory 1120, the display module 1140 may provide application information to a user through a display panel 1141.

In some embodiments, the electronic device 1000 may be configured as a smartphone, camera, smart TV, monitor, smartwatch, tablet, automotive display, or AR/VR headset. For example, the electronic device 1000 may be a smartphone including a touch-sensitive display area DA for interaction and a non-display area NDA including sensors and circuits for enhanced functionality. For example, the electronic device 1000 may be a television or monitor including a large display area DA for high-resolution video playback and a non-display area NDA incorporating driving circuits or connectivity modules for external inputs. For example, the electronic device 1000 may be a smartwatch including a display area DA optimized for compact and high-clarity visuals and a non-display area NDA integrating biometric sensors for health monitoring. In some cases, the electronic device 1000 be an AR/VR headset.

In some embodiments, memory 1120 may store information such as software codes for operating an application program 1123. The application program 1123 may include a software designed to execute specific tasks or provide functionality to a user. The application program 1123 may operate under the control of the processor 1110 and utilizes data stored in the memory 1120 to deliver a wide range of features, such as productivity tools, multimedia streaming and playback, file or mail deliveries or communication services. The application program 1123 interacts seamlessly with the user interface 1161 or touch screen 1142, allowing a user to launch, navigate, and utilize the program through user inputs such as touch, tap, gesture, and voice interaction.

Upon user selection of an application via touch screen 1142 or user interface 1161, the processor 1110 may execute the application program 1123 corresponding to the selected application retrieved from the memory 1120 to perform functionalities of the application. For example, when a user selects a camera application by tapping the icon (or a camera application icon) presented on the display panel 1141, the processor 1110 activates a camera module. The processor 1110 may transmit image data corresponding to a captured image acquired through the camera module to the display module 1140. The display module 1140 may display an image corresponding to the captured image through the display panel 1141.

As another example, when a user wishes to make a phone call, the user taps the telephone icon displayed on the display module 1140, the processor 1110 may execute a phone application program stored in the memory 1120. A telephone keypad may be presented on the display panel 1141 for the user to enter a phone number to call.

As another example, the display module 1140 may be integrated into an electronic device 1000, such as a laptop computer, smart TV, and tablet. A user wishing to access a multimedia streaming application (e.g., to watch a music video or movie) can do so by tapping the corresponding icon. This action activates the application, allowing the user to view the streamed content.

The processor 1110 may include a main processor 1111 and an auxiliary or coprocessor 1112. The main processor 1111 may include a central processing unit (CPU). The main processor 1111 may further include one or more of a graphics processing unit (GPU), a communication processor (CP), and an image signal processor (ISP).

The coprocessor 1112 may include a controller 1112-1. The controller 1112-1 may include an interface conversion circuit and a timing control circuit. The controller 1112-1 may receive an image signal from the main processor 1111, convert the data format of the image signal to match the interface specifications with the display module 1140, and output image data. The controller 1112-1 may output various control signals to drive the display module 1140. For example, the controller 1112-1 may drive the display module 1140 to display the icon on the display screen suitable for selection by a user to cause execution of an application program 1123.

The memory 1120 may store one or more application programs 1123 and various data used by at least one component (for example, the processor 1110 or the user interface 1161) of the electronic device 1000 and input data or output data for commands related thereto. For example, a camera application program, a GPS application program, an augmented reality and virtual reality application program, and other application programs that can be executed by the processor 1110 upon selection of corresponding icons presented on the display screen (or display panel 1141) via the touch screen 1142 or user interface 1161 by the user. Various setting data corresponding to user settings may be stored in the memory 1120. The memory 1120 may include volatile memory 1121 and non-volatile memory 1122.

The display module 1140 may output visual information (images) to the user. The display module 1140 may include the display panel 1141, a gate driver, the source driver, a voltage generation circuit, and a touch screen 1142. The display module 1140 may further include a window, a chassis, and a bracket to protect the display panel 1141. The display module 1140 may include at least a part of the configuration of the display device shown in FIG. 1.

The user interface 1161 serves as the interaction medium between a user and the electronic device 1000. The user interface 1161 may detect an input by a part (e.g., finger) of a user's body or an input by a pen or a mouse, and generate an electric signal or data value corresponding to the input. The user interface 1161 includes the fingerprint sensor 1162, the input sensor 1163, and a digitizer 1164.

The fingerprint sensor 1162 may sense a fingerprint for biometric recognition of the user and may also measure one or more biological signals such as blood pressure, moisture, and body mass.

The input sensor 1163 may sense user interactions including touch, tap, gesture, motion, spoken command, and eye movement. The input sensor 1163 includes optical sensors for image capture, eye tracking, or motion and gesture detection. Optical sensors may be infrared or semiconductor photodetectors. The input sensor 1163 includes audio and acoustic sensors, which may be MEMS microphones for voice recognition or sound-based interaction. The audio and acoustic sensors can be installed as part of the user interface 1161 or embedded in the display panel 1141.

The digitizer 1164 may generate a data value corresponding to coordinate information of input by a pen or a mouse to control movement of an onscreen cursor. The digitizer 1164 may generate the amount of change in electromagnetic due to the input as the data value. The digitizer may detect an input by a passive pen or transmit and receive data with an active pen or a remote.

At least one of the fingerprint sensor 1162, the input sensor 1163, or the digitizer 1164 may be implemented as a sensor layer formed on the top layer of the display panel 1141 through a continuous process with a process of forming elements (for example, the light emitting element, or the transistor) included in the display panel 1141.

The user interface 1161 may further include, for example, a gesture sensor, a gyro sensor that senses rotational movements, an acceleration sensor to track translational movement, a grip sensor, a pressure sensor, a proximity sensor, a color sensor, an infrared (IR) emitter and camera sensor for tracking gaze direction and eye movements, a temperature sensor, or a light sensor. For example, the gyro sensor, acceleration sensor, and infrared emitter and camera may be particularly suitable for AR/VR headset functions.

The touch screen 1142 includes touch sensors embedded in semiconductor layers of the display panel 1141 to sense pressure applied to the top layer (screen) of the display panel 1141. The touch sensors can be a capacitive or a resistive type. The touch screen 1142 may serve as the primary interface for the user to select and navigate applications, control, and interact with the electronic device 1000.

The display panel 1141 (or display) may include a liquid crystal display panel, an organic light emitting display panel, or an inorganic light emitting display panel, and the type of the display panel 1141 is not particularly limited. The display panel 1141 may be of a rigid type or a flexible type that can be rolled or folded. The display module 1140 may further include a supporter, bracket, or heat dissipation member that support the display panel 1141. The display panel 1141 may include the display unit shown in FIG. 1.

The power source module 1150 may supply power to the components of the electronic device 1000. The power source module 1150 may include a battery that charges the power source voltage. The battery may include a non-rechargeable primary battery or a rechargeable secondary battery or fuel cell. The power source module 1150 may include a power management integrated circuit (PMIC). The PMIC may supply optimized power source to each of the components described above including the display module 1140.

Although specific embodiments and application examples are described herein, other embodiments and modifications may be derived from the above description. Therefore, the spirit of the disclosure is not necessarily limited to such embodiments, and extends to the scope of the claims set forth below, various obvious modifications, and equivalents.

Although the disclosure has been specifically described according to the above-described embodiments, it should be noted that the above-described embodiments are for describing the disclosure and not necessarily for limiting the scope of the disclosure. Those of ordinary skill in the art to which the disclosure pertains will understand that various modifications are possible within the scope of the technical spirit of the disclosure.

What is claimed is:

1. A display device comprising:

a controller configured to generate a first data control signal for operating the display device in a first mode and a second data control signal for operating the display device in a second mode;

a data driver configured to receive one of the first data control signal and the second data control signal;

a plurality of first green sub-pixels connected to the data driver; and a plurality of second green sub-pixels connected to the data driver and having a viewing angle less than a viewing angle of the plurality of first green sub-pixels, wherein the data driver is configured further to drive, in the first mode and the second mode, the plurality of first green sub-pixels and the plurality of second green sub-pixels, wherein, in the first mode, the plurality of first green sub-pixels and the plurality of second green sub-pixels are driven with a first luminance, and wherein, in the second mode, the plurality of second green sub-pixels are driven with a second luminance lower than the first luminance, and the plurality of first green sub-pixels are driven with a third luminance lower than the second luminance.

2. The display device according to claim 1, wherein a sum of the second luminance and the third luminance is equal to the first luminance.

3. The display device according to claim 2, further comprising:

a plurality of first red sub-pixels;

a plurality of second red sub-pixels having a viewing angle less than a viewing angle of the plurality of first red sub-pixels;

a plurality of first blue sub-pixels; and a plurality of second blue sub-pixels having a viewing angle less than a viewing angle of the plurality of first blue sub-pixels, wherein an aperture ratio corresponding to the plurality of first green sub-pixels and the plurality of second green sub-pixels is less than an aperture ratio corresponding to the plurality of first red sub-pixels and the plurality of second red sub-pixels, and wherein an aperture ratio corresponding to the plurality of first blue sub-pixels and the plurality of second blue sub-pixels is greater than the aperture ratio corresponding to the plurality of first red sub-pixels and the plurality of second red sub-pixels.

4. The display device according to claim 3, wherein, in the second mode, the plurality of second red sub-pixels and the plurality of second blue sub-pixels are driven with the first luminance, and the plurality of first red sub-pixels and the plurality of first blue sub-pixels are not driven.

5. The display device according to claim 4, wherein, in the second mode, the third luminance is set to a value so that a ratio of a luminance of red light output from the plurality of second red sub-pixels, a luminance of green light output from the plurality of first green sub-pixels and the plurality of second green sub-pixels, and a luminance of blue light output from the plurality of second blue sub-pixels at a first viewing angle is equal to a ratio of a luminance of red light output from the plurality of first red sub-pixels, a luminance of green light output from the plurality of first green sub-pixels, and a luminance of blue light output from the plurality of first blue sub-pixels at the first viewing angle.

6. The display device according to claim 3, wherein, in the second mode, the plurality of first blue sub-pixels are further driven.

7. The display device according to claim 6, wherein, in the second mode, the plurality of second blue sub-pixels are driven with a fourth luminance lower than the first luminance, and the plurality of first blue sub-pixels are driven with a fifth luminance lower than the fourth luminance.

8. The display device according to claim 7, wherein a sum of the fourth luminance and the fifth luminance is equal to the first luminance.

9. A display device operating in a first mode and a second mode, comprising:

a first pixel including a first bank disposed on a display element layer; and a second pixel including the first bank disposed on the display element layer and a second bank disposed on the first bank and overlapping the first bank, wherein, in the first mode and the second mode, a plurality of first green sub-pixels of the first pixel and a plurality of second green sub-pixels of the second pixel are driven, wherein, in the first mode, the plurality of first green sub-pixels and the plurality of second green sub-pixels are driven with a first luminance, and wherein, in the second mode, the plurality of second green sub-pixels are driven with a second luminance lower than the first luminance, and the plurality of first green sub-pixels are driven with a third luminance lower than the second luminance.

10. The display device according to claim 9, wherein a sum of the second luminance and the third luminance is equal to the first luminance.

11. The display device according to claim 10, wherein an aperture ratio corresponding to the plurality of first green sub-pixels and the plurality of second green sub-pixels is less than an aperture ratio corresponding to a first red sub-pixel of the first pixel and a second red sub-pixel of the second pixel, and wherein the aperture ratio corresponding to the first red sub-pixel and the second red sub-pixel is less than an aperture ratio corresponding to a first blue sub-pixel of the first pixel and a second blue sub-pixel of the second pixel.

12. The display device according to claim 11, wherein, in the second mode, the second red sub-pixel and the second blue sub-pixel are driven with the first luminance, and the first red sub-pixel and the first blue sub-pixel are not driven.

13. The display device according to claim 12, wherein the third luminance is set to a value so that a ratio of a luminance of red light output from the second red sub-pixel, a luminance of green light output from the plurality of first green sub-pixels and the plurality of second green sub-pixels, and a luminance of blue light output from the second blue sub-pixel at a first viewing angle is equal to a ratio of a luminance of red light output from the first red sub-pixel, a luminance of green light output from the plurality of first green sub-pixels, and a luminance of blue light output from the first blue sub-pixel at the first viewing angle, in the second mode.

14. The display device according to claim 11, wherein, in the second mode, the first blue sub-pixel is further driven.

15. The display device according to claim 14, wherein, in the second mode, the second blue sub-pixel is driven with a fourth luminance lower than the first luminance, and the first blue sub-pixel is driven with a fifth luminance lower than the fourth luminance.

16. The display device according to claim 15, wherein a sum of the fourth luminance and the fifth luminance is equal to the first luminance.

17. An electronic device, comprising:

a processor configured to provide input image data; and a display device configured to display an image based on the input image data, the display device operating in a first mode and a second mode, wherein the display device includes:

a controller configured to generate a first data control signal for operating the display device in the first mode and a second data control signal for operating the display device in the second mode;

a data driver configured to receive one of the first data control signal and the second data control signal;

a plurality of first green sub-pixels connected to the data driver; and a plurality of second green sub-pixels connected to the data driver and having a viewing angle less than a viewing angle of the plurality of first green sub-pixels, and wherein the data driver is configured further to drive, in the first mode and the second mode, the plurality of first green sub-pixels and the plurality of second green sub-pixels, wherein, in the first mode, the plurality of first green sub-pixels and the plurality of second green sub-pixels are driven with a first luminance, and wherein, in the second mode, the plurality of second green sub-pixels are driven with a second luminance lower than the first luminance, and the plurality of first green sub-pixels are driven with a third luminance lower than the second luminance.

18. The electronic device of claim 17, further comprising:

a memory having stored application programs for execution by the processor; and a user interface configured to sense user input via touch or cursor select of an icon presented on the display device to switch an operation mode of the display device from the first mode to the second mode, wherein the processor is caused to execute one or more of the stored application programs upon receipt of the user input.

* * * * *